United States Patent [19]
Miyawaki et al.

[11] Patent Number: 5,952,694
[45] Date of Patent: Sep. 14, 1999

[54] SEMICONDUCTOR DEVICE MADE USING PROCESSING FROM BOTH SIDES OF A WORKPIECE

[75] Inventors: Mamoru Miyawaki, Isehara; Yasushi Kawasumi, Fujisawa; Shunsuke Inoue, Yokohama; Yutaka Akino, Isehara; Toru Koizumi, Yokohama; Tetsunobu Kohchi, Hiratsuka, all of Japan

[73] Assignee: Canon Kabushiki Kaisha, Tokyo, Japan

[21] Appl. No.: 08/403,580

[22] Filed: Mar. 14, 1995

Related U.S. Application Data

[63] Continuation of application No. 08/145,673, Nov. 4, 1993, abandoned, which is a continuation of application No. 07/978,436, Nov. 18, 1992, abandoned.

[30] Foreign Application Priority Data

| Nov. 20, 1991 | [JP] | Japan | 3-304705 |
| Nov. 29, 1991 | [JP] | Japan | 3-339373 |
| Jan. 24, 1992 | [JP] | Japan | 4-032946 |
| Jan. 30, 1992 | [JP] | Japan | 4-038461 |

[51] Int. Cl.$^6$ .......................... H01L 27/01; H01L 27/12; H01L 31/0392; H01L 27/082
[52] U.S. Cl. .......................... 257/347; 257/586
[58] Field of Search .................. 257/57, 526, 510–515, 257/517, 506, 507, 347–354, 586; 438/404, 405, 412, 311, 353, 362, 363

[56] References Cited

U.S. PATENT DOCUMENTS

| 3,767,304 | 10/1973 | Keenan et al. | 356/51 |
| 4,238,760 | 12/1980 | Carr | 357/30 |
| 4,261,003 | 4/1981 | Magdo et al. | 257/526 |
| 4,677,735 | 7/1987 | Malhi | 257/351 |
| 4,710,794 | 12/1987 | Koshino et al. | 257/526 |
| 4,755,862 | 7/1988 | Noguier et al. | 257/506 |
| 4,875,086 | 10/1989 | Malhi et al. | 357/54 |
| 4,968,628 | 11/1990 | Delgado et al. | 437/21 |
| 4,979,006 | 12/1990 | Tanaka | 257/57 |
| 4,984,033 | 1/1991 | Ishizu et al. | 257/347 |
| 5,004,705 | 4/1991 | Blackstone | 437/225 |
| 5,043,782 | 8/1991 | Koizumi et al. | 357/13 |
| 5,043,785 | 8/1991 | Mizutani et al. | 357/30 |
| 5,173,446 | 12/1992 | Asakawa et al. | 438/412 |
| 5,459,346 | 10/1995 | Asakawa et al. | 257/347 |

FOREIGN PATENT DOCUMENTS

| 0256397 | 2/1988 | European Pat. Off. . |
| 2832152 | 1/1979 | Germany . |
| 0031274 | 2/1985 | Japan | 257/552 |

OTHER PUBLICATIONS

IBM Technical Disclosure Bulletin, vol. 22, No. 2, Jul. 1979, New York, US, pp. 841–843, XP002033481, Anonymous; "IR Alignment of Two or More Opaque Silicon Wafers", Jul. 1979.

Bell Sys. Tech. J., vol. 35, 1956, pp. 333–347, Uhlir, Jr. "Electrolytic Shaping of Germanium and Silicon".

J. Electrochem. Soc., vol. 127, No. 2, Feb. 1980, pp. 476–483, Unagami, "Formation Mechanism of Porous Silicon Layer etc.".

Appl. Phys. Let., vol. 42, No. 4, Feb. 15, 1983, pp. 386–388, Holmstrom et al. "Complete dielectric isolation by highly selective etc.".

R.P. Zingg, et al. "Dual–Gate SOI CMOS Technology by Local Overgrowth (LOG)", 1989 IEEE SOS/SOI Technology Conference, 1989, New York, pp. 134–135.

*Primary Examiner*—Brian Dutton
*Attorney, Agent, or Firm*—Fitzpatrick, Cella, Harper & Scinto

[57] ABSTRACT

A semiconductor device having a semiconductor layer formed on a substrate having an insulating surface, comprises a first region formed by processing the semiconductor layer from one major surface thereof, and a second region formed by processing the semiconductor layer from the other major surface, the first and second regions cooperating to constitute a semiconductor function element, isolation region or the like.

4 Claims, 26 Drawing Sheets

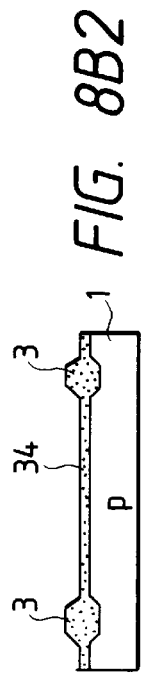 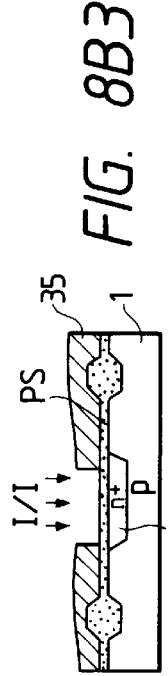 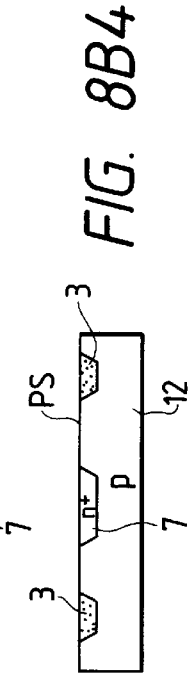 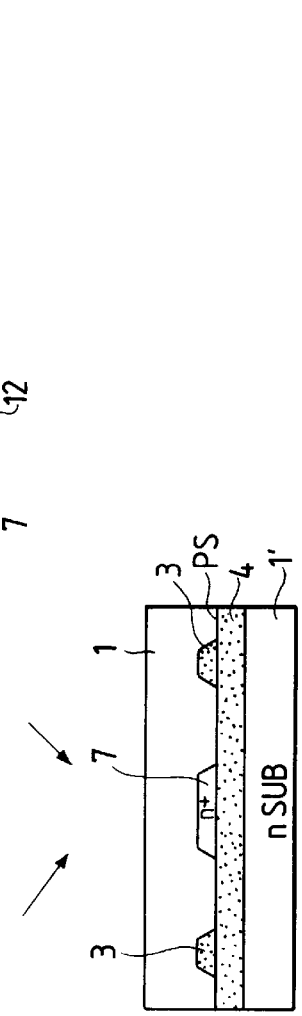 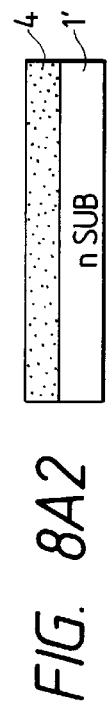  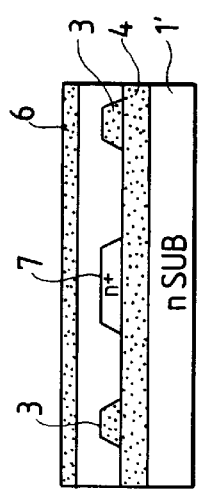
FIG. 8B1  FIG. 8B2  FIG. 8B3  FIG. 8B4
FIG. 8A1  FIG. 8A2  FIG. 8C1  FIG. 8C2

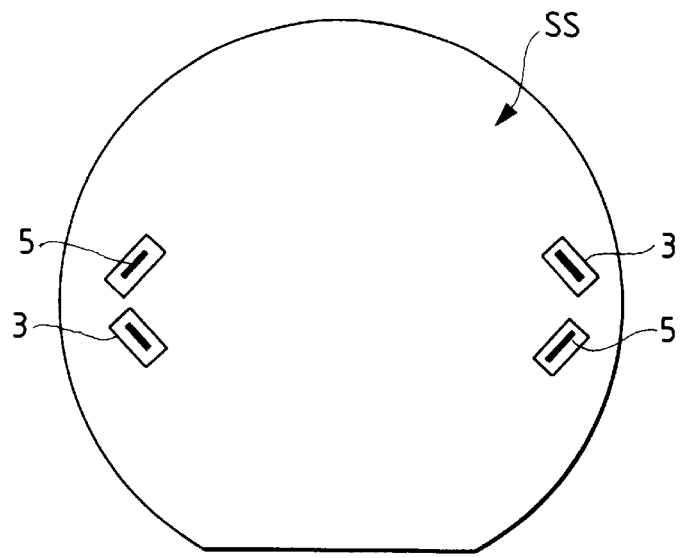
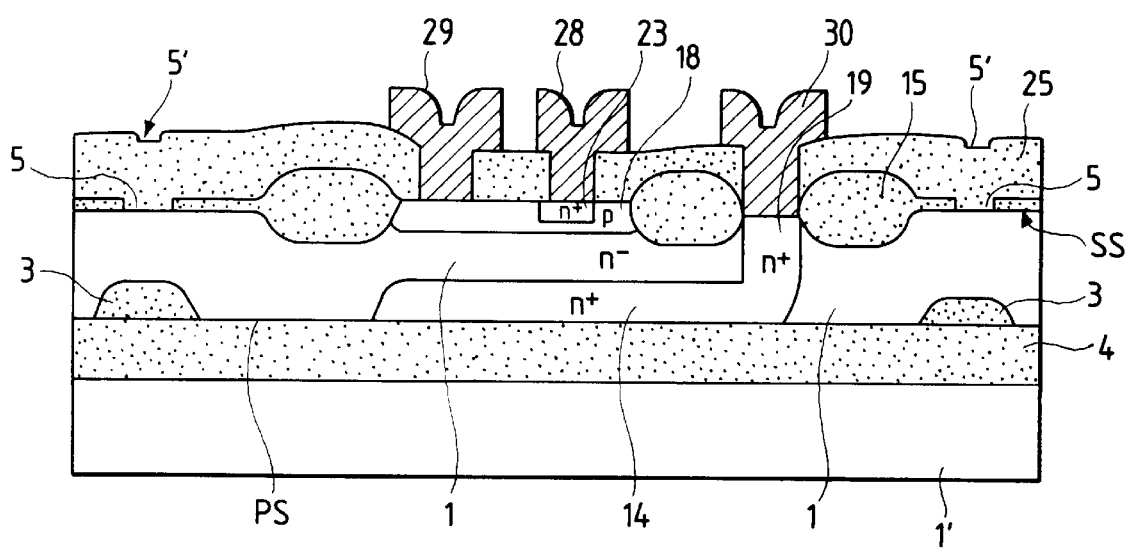

FIG. 16B1 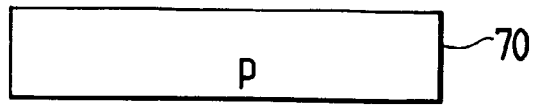
FIG. 16B2 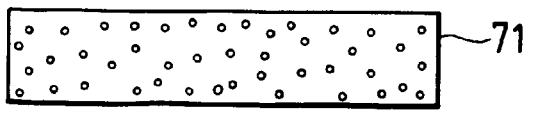
FIG. 16B3 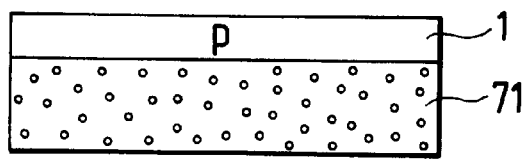
FIG. 16B4 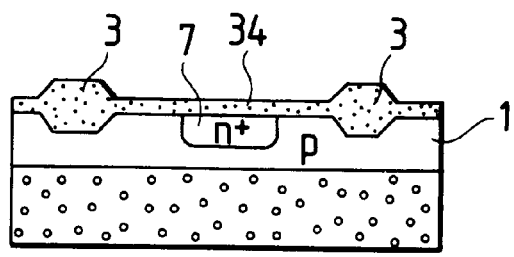
FIG. 16B5 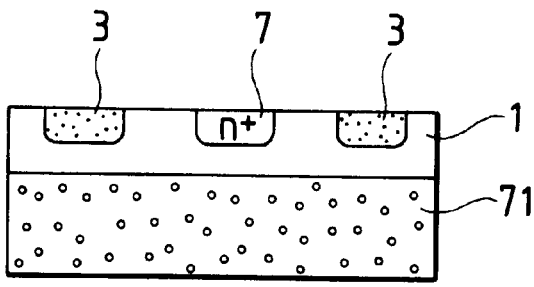
FIG. 16C1 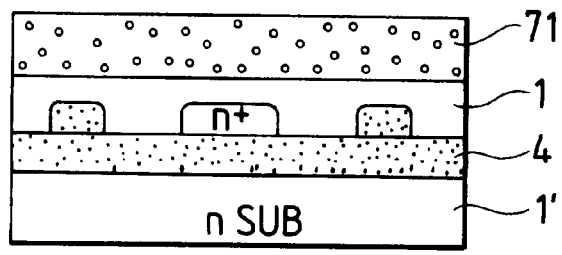

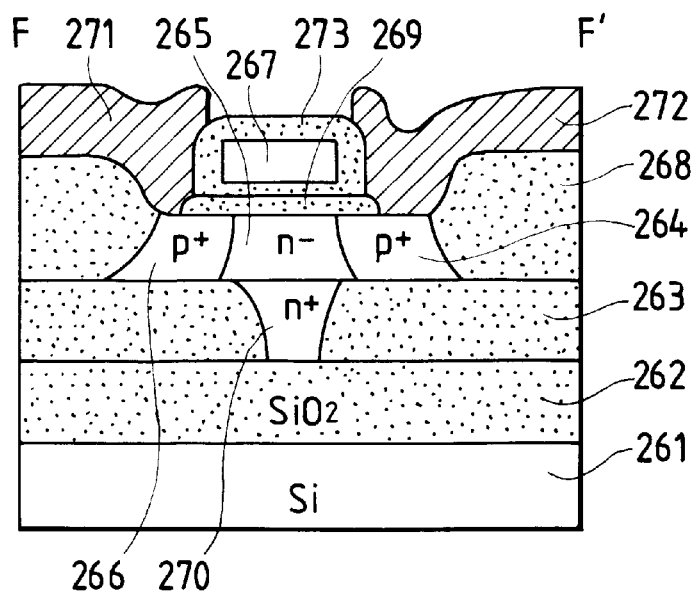
FIG. 45
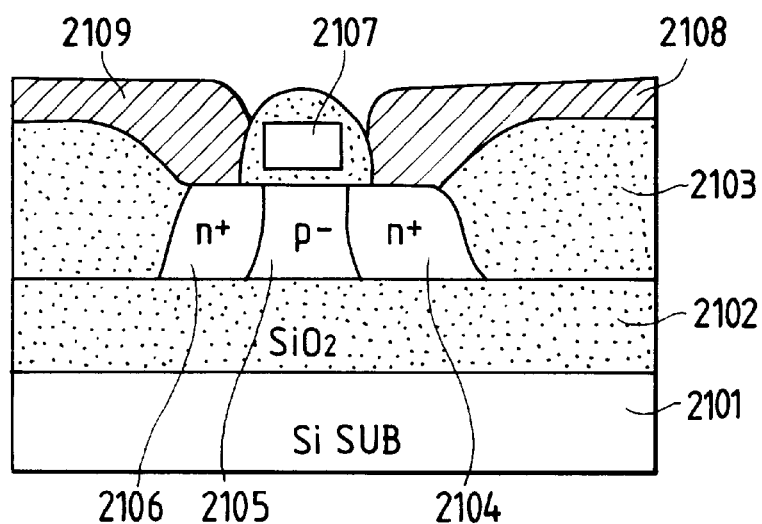
FIG. 46
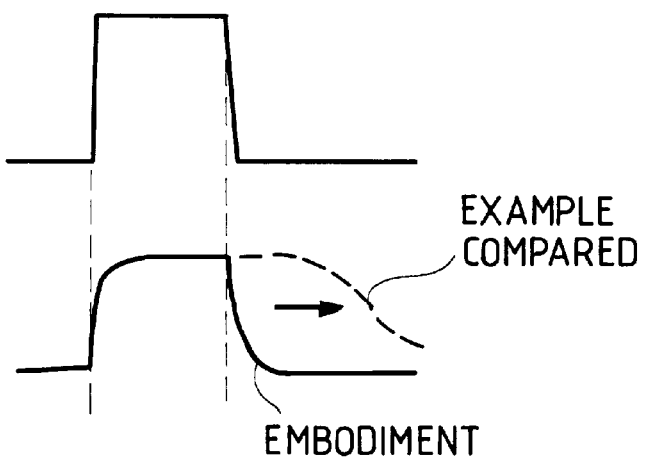
FIG. 47A
FIG. 47B

SEMICONDUCTOR DEVICE MADE USING PROCESSING FROM BOTH SIDES OF A WORKPIECE

This application is a continuation of application Ser. No. 08/145,673 filed Nov. 4, 1993, which is a continuation of application Ser. No. 07/978,436 filed Nov. 18, 1992, both now abandoned.

BACKGROUND OF THE INVENTION

1. Field of the Invention

The present invention relates to a semiconductor device used in a variety of electronic equipment and a method of manufacturing the same and, more particularly, to a technique associated with an alignment or element isolation method thereof.

2. Related Background Art

FIG. 1 is a sectional view of a semiconductor device used in a conventional LSI or the like. More specifically, FIG. 1 shows a typical npn bipolar transistor. A semiconductor substrate 101 consists of a p-type semiconductor. An $n^+$-type buried layer 102 and element isolation layers 103 and 103' are formed in the semiconductor substrate 101. A collector contact $n^+$-type layer 104 is formed adjacent to the $n^+$-type buried layer 102. Field oxide films 105, 105', and 105" can be formed by selective oxidation. An $n^-$-type epitaxial layer 106 has a thickness of 1.2 to 2 μm and a concentration of about $10^{15}$ cm$^{-3}$. The bipolar transistor has a base diffusion layer 107 and an $n^+$-type emitter layer 108. In this conventional example, the $n^+$-type emitter layer 108 is formed by diffusion from an $n^+$-type poly-Si layer 110. An insulating interlayer 109 consists of BPSG (borophosphosilicate glass). Emitter, base, and collector wiring layers 111, 112, and 114 consist of Al—Si. The transistor also has a base contact $p^+$-type diffusion layer 113. A passivation film 115 consists of SiN.

Typical parameters for determining the performance of the bipolar transistor having the above structure are a base width $W_B$ and a collector width $W_C$ shown in FIG. 1. It is important to control these widths precisely, to make them as small as possible.

The base width $W_B$ is determined by a method of forming the base diffusion layer 107 and the $n^+$-type emitter layer 108 by a low-temperature process and reducing the width of the base diffusion layer 107, a method of reducing the thicknesses of the base and emitter layers, or the like. The base width $W_B$ can be reduced as small as 500 to 1,000 Å on the research and development level.

On the other hand, the collector width $W_C$ cannot be easily reduced for the following reasons.

(Reason 1)

The collector width $W_C$ is defined as the distance between the $n^+$-type buried layer 102 and the bottom of the base region having width $W_B$, i.e., the width of a lightly doped layer subjected to depletion. Unlike the emitter and base regions, the lightly doped layer is located deep in the substrate, and relatively far from the substrate surface.

(Reason 2)

The structures of the $n^+$-type buried layer and the like formed in the first half of the process depend on subsequent annealing due to reason 1, and sufficient process margins must be maintained.

(Reason 3)

Impurity layers having different conductivity types must be simultaneously formed inside the substrate from the substrate surface in such a manner that npn and pnp transistors must be formed as bipolar transistors, and NMOS and PMOS transistors must be formed as MOSFETs (the collector width in a BJT corresponds to the width between the gate and the less heavily doped well in a MOSFET). Therefore, the process design is difficult.

A desired collector width cannot be easily realized, due to the above reasons.

In order to solve the above problem, there is attempted a method of forming a buried layer such as the $n^+$-type buried layer 102 by high-energy ion implantation. During the ion implantation, however, high-energy ions bombard the side wall of the ion-implantation apparatus and thus produce metal ions, and these ions are also implanted inside the Si substrate, thereby forming crystal defects and degrading the element characteristics and hence posing another technical problem which is more difficult to solve.

In addition, the element isolation region of the conventional semiconductor device should be noticed. Element isolation is performed by the thick field oxide films 105, 105', and 105" and the P-type element isolation layers 103 and 103' thereunder in FIG. 1. Although the field oxide film 105 is preferably formed deep to achieve perfect dielectric isolation, lateral oxidation may cause the insulating layer to occupy most of the surface, and the area of the active region for element formation is thus undesirably reduced.

According to still another technical problem of the prior art, even in a device having a bipolar transistor and a MOS transistor, an element isolation region has a predetermined relationship between its depth and its lateral width. This element isolation region is insufficient to perform effective element layout.

The present inventors carefully examined the fundamental cause for these conventional technical problems, and found that the cause was based on the fact that a semiconductor element was conventionally formed substantially from only one surface of a semiconductor substrate.

More specifically, a semiconductor layer and an insulating layer are formed in one surface of the semiconductor substrate, and etching is also performed from this one surface. The operations on the other surface are limited to electrode formation and deposition of phosphorus glass for extrinsic gettering. All the semiconductor regions and the element isolation regions are selectively formed from the above one surface.

On the other hand, an SOI (Silicon On Insulator) device comprising a substrate with an insulating surface and a semiconductor layer in which an element is formed is known as a device capable of reducing the parasitic capacitance of a semiconductor function element, and capable of performing a high-speed operation. Even in this SOI device, since a semiconductor layer having a thickness of several μm is mainly used, the process is performed from one surface, as a matter of course.

In the design of a semiconductor element, physical values associated with impurity diffusion from the upper surface are used as parameters to determine a base width, an emitter width, a collector width, a channel width, the area of an element isolation region, and the like.

Within the limits of elements formed by this design rule, easily feasible improvements of element characteristics are limited.

SUMMARY OF THE INVENTION

It is an object of the present invention to provide a semiconductor device having a new and improved element isolation region and a method of manufacturing the same.

It is another object of the present invention to provide a semiconductor device having a new and improved structure obtained by processing a semiconductor layer from both upper and lower surfaces thereof and a method of manufacturing the same.

It is still another object of the present invention to provide a semiconductor device having optimal alignment marks for use in the processing of the semiconductor layer from both upper and lower surfaces thereof and a method of manufacturing the same.

It is still another object of the present invention to provide a semiconductor device which can have a high integration density, can be manufactured at low cost, and has better characteristics than those of a conventional semiconductor device, and a method of manufacturing the same.

In order to achieve the above objects of the present invention, there is provided a semiconductor device having a semiconductor layer formed on a substrate having an insulating surface, comprising:

a first region formed by processing the semiconductor layer from one major surface thereof, and a second region formed by processing the semiconductor layer from the other major surface, wherein the first and second regions cooperate to constitute a semiconductor function element.

In order to achieve the above objects of the present invention, there is also provided a semiconductor device having a semiconductor layer formed on a substrate having an insulating surface, the semiconductor layer having a plurality of semiconductor function elements, comprising:

a first region formed by processing the semiconductor layer from one major surface thereof, and a second region formed by processing the semiconductor layer from the other major surface, wherein the first and second regions cooperate to constitute an element isolation region.

In order to achieve the above objects of the present invention, there is also provided a method of manufacturing a semiconductor device having a semiconductor layer formed on a support having an insulating surface, comprising the steps of:

forming a first region by processing the semiconductor layer from one major surface thereof;

bonding the one major surface to the support;

forming a second region by processing the semiconductor layer from the other major surface; and forming a semiconductor function element having the first and second regions.

In order to achieve the above objects of the present invention, there is also provided a method of manufacturing a semiconductor device having a semiconductor layer formed on a support having an insulating surface, comprising the steps of:

forming a first region by processing the semiconductor layer from one major surface thereof;

bonding the one major surface to the support;

forming a second region by processing the semiconductor layer from the other major surface; and forming an element isolation region having the first and second regions.

In order to achieve the above objects of the present invention, there is also provided a method of manufacturing a semiconductor device, comprising the steps of:

preparing a first body having a first semiconductor layer;

forming an alignment mark and a first region for forming a structural body in a first surface of the first semiconductor layer;

bonding the first body and a second body such that the first surface faces the second body; and performing alignment using a region serving as the alignment mark to process a second surface of the first semiconductor device.

In order to achieve the above objects of the present invention, there is also provided a semiconductor device having a first semiconductor layer on a substrate, wherein a region consisting of a material different from that of the first semiconductor layer for forming a structural body and an alignment mark portion are formed on a substrate-side surface of the first semiconductor layer.

In order to achieve the above objects of the present invention, there is also provided a method of manufacturing a semiconductor device in an SOI body having a heavily doped buried layer formed in a semiconductor body, wherein in mask alignment for the buried layer, a position of the buried layer is recognized by measuring a transmitted light intensity difference caused by the presence/absence of the buried layer, using light having a wavelength which can be transmitted through the SOI body.

BRIEF DESCRIPTION OF THE DRAWINGS

FIGS. 8A1 and 8A2, FIGS. 8B1 to 8B4, and FIGS. 8C1 and 8C2 are illustrative views for explaining another method of manufacturing the semiconductor device according to Embodiment 1;

FIG. 9 is an illustrative plan view showing another semiconductor device according to Embodiment 2 of the present invention;

FIG. 10 is an illustrative sectional view showing a semiconductor device according to Embodiment 3 of the present invention;

FIGS. 16B1 to 16B5 and FIG. 16C1 are illustrative sectional views for explaining the steps in manufacturing a semiconductor device according to Embodiment 9 of the present invention;

FIG. 45 is an illustrative sectional view of the semiconductor device in FIG. 43 along the line FF';

FIG. 46 is an illustrative sectional view showing a semiconductor device of an example compared; and FIGS. 47A and 47B are charts showing a difference between the characteristics of an embodiment of the present invention and the example compared.

DETAILED DESCRIPTION OF THE PREFERRED EMBODIMENTS

Figure 1:
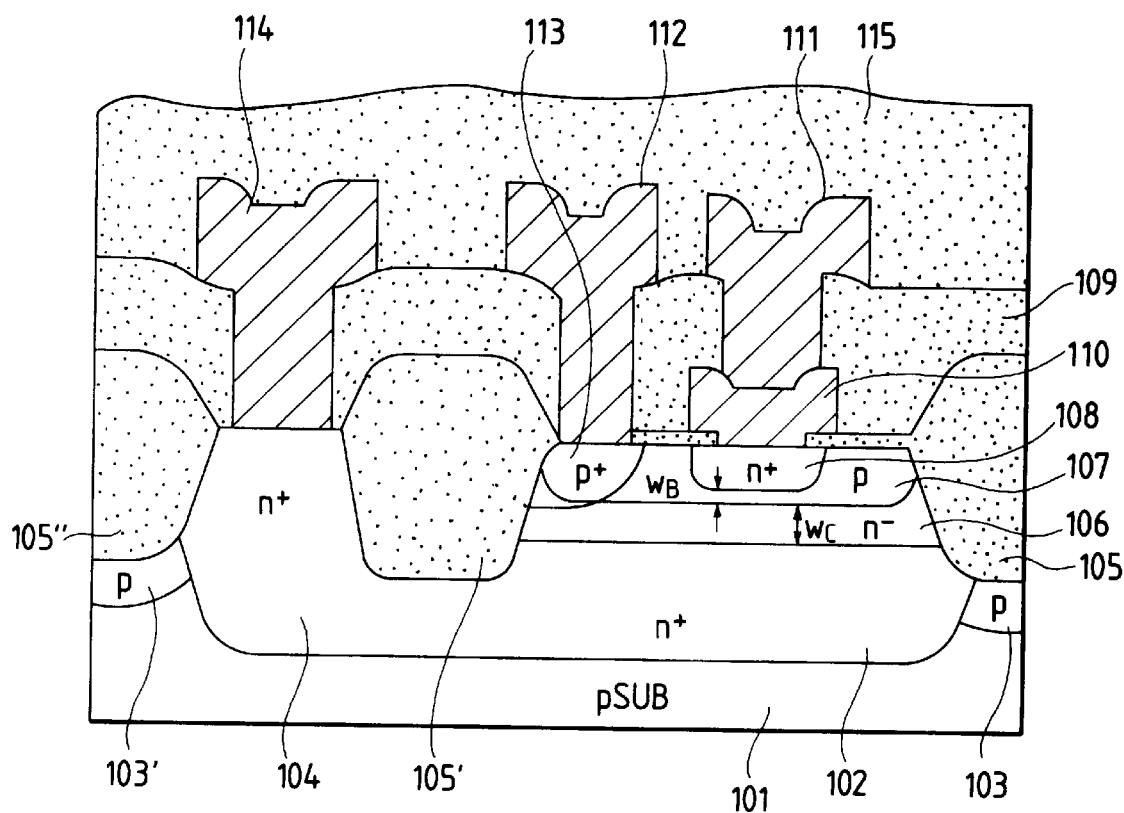
FIG. 1 is an illustrative sectional view showing a bipolar transistor as a conventional semiconductor device.

According to a preferred embodiment of the present invention, a method of manufacturing a semiconductor device is characterized by a semiconductor layer processed from both surfaces thereof to form at least one semiconductor element or to form cooperative element isolation regions.

As an intermediate product of a semiconductor device suitable for such processing, there is provided a wafer for a semiconductor device having a first semiconductor layer formed on a substrate, wherein (1) a region consisting of a material different from that of the first semiconductor layer for forming a structural body and (2) an alignment mark portion are formed on a substrate-side surface of the first semiconductor layer. In addition, there is also provided an alignment method suitable for processing from both surfaces.

The region mentioned in (1) includes a region having an electric conductivity different from that of the first semiconductor layer, a region having a conductivity type different therefrom, or the like. Finally, the region serves as a buried layer for a bipolar transistor, a gate electrode region of a field effect transistor, or an element isolation region. Preferably, the region is selectively formed in the lower surface of the first semiconductor region.

The alignment mark is a reference mark used for aligning a wafer in photolithography. The position of this alignment mark may be recognized by light transmission, light reflection, or light diffusion. The alignment mark preferably has a structure recessed from the surface of the semiconductor region.

Materials used in the present invention are a semiconductor material, an insulating material, and a conductive material. Typical examples of these materials are Si, Ge, C, GaAs, InP, ZnSe, SiO, SiN, SiON, AlO, TiN, Al, W, Cu, Mo, Ti, silicides, and organic materials.

[Processing Method]

Basic steps used in the present invention are as follows.

(1) A pair of semiconductor wafers are prepared, and an oxide film is formed on the upper surface of the first wafer, as needed.

(2) A structural body (e.g., an impurity diffusion layer or an oxide film layer) is formed in the upper surface of the second wafer.

(3) The upper surface of the first wafer is bonded to the upper surface of the second wafer, and the lower surface of the second wafer is removed to a desired depth, as needed.

(4) The lower surface of the second wafer is used as a new upper surface, and a structural body is formed in this new upper surface.

(5) A semiconductor function element or an element isolation region is formed.

[Alignment Method]

In the above steps, a structural body is formed in the first upper surface of the second wafer, and at the same time, an alignment structural body is formed. The alignment structural body is detected from the second upper surface (i.e., the new upper surface) after the first and second wafers are bonded. Alignment is performed to form a semiconductor region from the new upper surface.

In one alignment method used in the present invention, is characterized in that, after a main alignment mark is formed on the lower surface of one substrate on which a semiconductor element is to be formed, and the semiconductor element is formed in the upper surface of the substrate surface, the other substrate serving as a body is bonded to the substrate surface, an alignment mark aligned with the main alignment mark is formed in the lower surface of the substrate serving as the body, and the alignment mark formed in the lower surface of the substrate serving as the body is used in the subsequent alignment process.

According to this alignment method, since the pattern (alignment mark) corresponding to the pattern (alignment mark) formed in the major surface of the wafer is formed in the lower surface of the wafer, alignment can be performed upon bonding between the two wafers using the pattern (alignment pattern) in the lower surface of the integral body.

The above method of forming the alignment marks will be described with reference to FIGS. 2A to 2E.

Figure 2A:
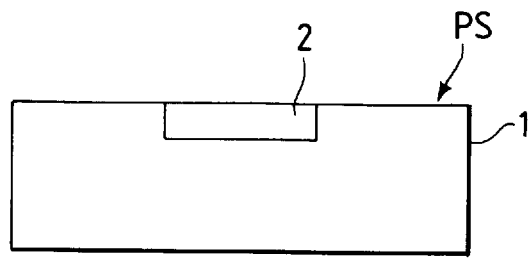
FIGS. 2A to 2E are sectional views for explaining the steps in manufacturing a semiconductor device according to the present invention.
Figure 2B:
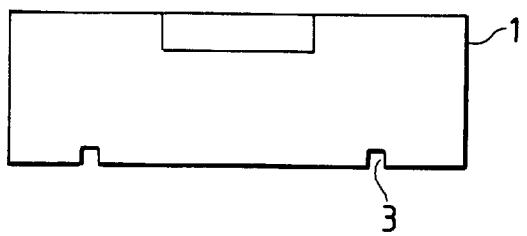

From a first major surface PS, a buried layer or diffusion layer 2 is formed in a wafer 1 serving as a substrate on which a semiconductor element is to be formed (the step in FIG. 2A).

Alignment marks 3 are formed in the lower surface of the wafer 1 so as to align with the pattern of the diffusion layer 2.

Note that the formation order of the alignment marks 3 and the diffusion layer 2 may be reversed. That is, after the alignment marks 3 are formed in the lower surface of the wafer 1, the diffusion layer 2 may be formed in the upper surface of the wafer 1.

Figure 2C:
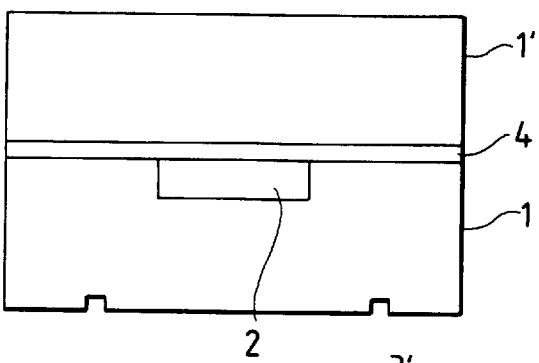

The wafer 1 is bonded to a silicon wafer 1' serving as a body having the upper surface covered with an insulating film 4 (the step in FIG. 2C).

Figure 2D:
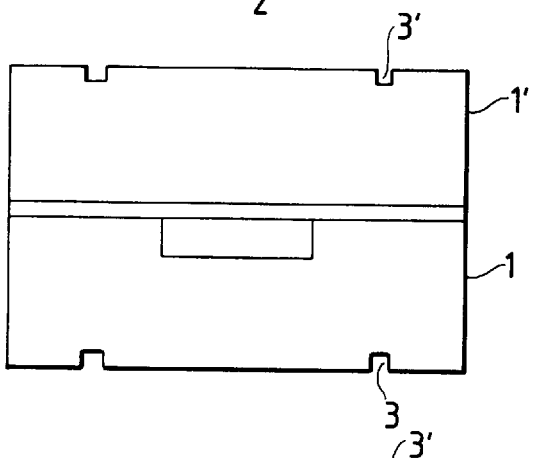
Figure 2E:
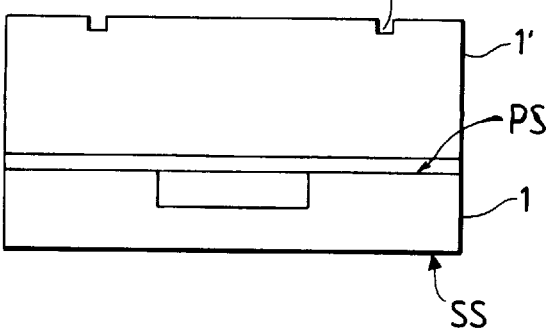

Alignment marks 3' corresponding to the alignment marks 3 formed in the lower surface of the wafer 1 are then formed in the lower surface of the bonded wafer 1' (the step in FIG. 2D).

Finally, the wafer 1 is mechanically cut or thinned to a desired thickness by etching. At this time, the alignment marks 3 are removed by mechanical cutting or etching (the step in FIG. 2E).

It is, therefore, possible to prepare an SOI substrate having the buried layer 2. In addition, by utilizing the alignment marks 3' formed in the lower surface of the wafer, a pattern matched with the buried layer 2 can be accurately formed in the upper surface of the wafer from a second major surface SS in the subsequent process.

The important factors in bonding between the two substrates are alignment of processing positions on the upper and lower surfaces of the semiconductor region and flatness of the bonding surface between the substrates. The required degree of average flatness preferably falls within the range of 150 Å.

For example, when the semiconductor layer has a small thickness of 1,000 Å, alignment can be facilitated since light can pass through this thin film.

However, an actual product is manufactured using not only thin films but also thick films having thicknesses of 1 to 3 $\mu$m or more, and a diode and a bipolar transistor may be formed in the thick film region. Therefore, although an alignment technique for processing the lower surface portion corresponding to the thick semiconductor layer is required, a small amount of light is transmitted through the thick semiconductor layer. Therefore, it may be difficult to perform alignment.

In this embodiment, when each alignment mark is constituted by a hollow portion, no trouble occurs in flatness of the bonding surface.

For example, when a convex alignment mark is formed by polysilicon or the like, the projection having a height of several thousands of Å is formed. When a surface having the alignment mark serves as a bonding surface, a portion surrounding the alignment mark is kept floating. To the contrary, excellent bonding can be performed when the alignment mark is constituted by the hollow portion.

If the thickness of the semiconductor layer is 1 $\mu$m or less, a simple recess may be used as the alignment mark. For example, when the thickness of a silicon layer is 1.5 $\mu$m, light propagates at least a distance of 3 $\mu$m in silicon when light having a wavelength of 500 nm is incident from the lower surface to detect the alignment mark formed in the upper surface. Even if it is assumed that incident light has a loss in only silicon, only 3% of the incident light can be detected because the absorption coefficient $\alpha$ of the light is 1.2E4 cm$^{-1}$.

In order to detect the mark on the reflecting surface in a semiconductor layer having a thickness of 1 $\mu$m or more, the length of an optical path must be set to be $1/\alpha$ or less. If a distance to the bottom portion of the mark is given as $\chi$, the following condition must be satisfied:

$$\alpha \times (2\chi) \leq 1$$

For this reason, when the hollow portion is formed as the alignment mark in the first major surface, and the distance $\chi$ between the bottom portion of the recess and the second major surface as the surface opposite to the first major surface satisfies the above condition, light can pass only through the hollow portion serving as the alignment mark to detect the alignment mark. Therefore, the second major surface can be processed on the basis of the alignment mark in the first major surface.

The above alignment method will be described with reference to FIGS. 3 and 4.

Figure 3:
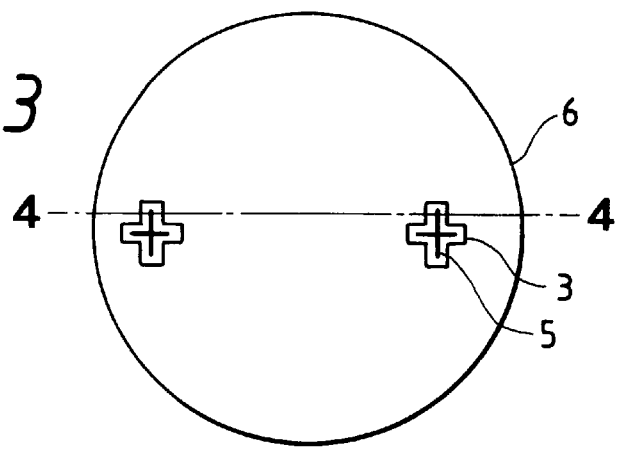
FIG. 3 is an illustrative plan view showing a semiconductor device according to the present invention.

FIG. 3 is a plan view showing a semiconductor body having an SOI structure obtained by bonding a first body or first semiconductor layer 1 and a second body or wafer 1'. FIG. 4 is a sectional view in FIG. 3 along the line AA'.

FIG. 3 is a plan view showing the structure in which the first semiconductor layer 1 is bonded to the wafer 1 serving as a support substrate through a first major surface PS when viewed from a second major surface SS.

Referring to FIG. 3, an oxide film 6 is formed on the second major surface SS, and alignment marks (hollow portions) are formed in the first major surface PS. Alignment marks 5 are formed in the second major surface SS. More specifically, the alignment marks 5 are formed by etching the oxide film 6 while being aligned with the alignment marks 3.

At this time, in order to detect the alignment marks 3, an He—Ne laser (wavelength: about 630 nm) or the like may be used as a light source.

Figure 5:
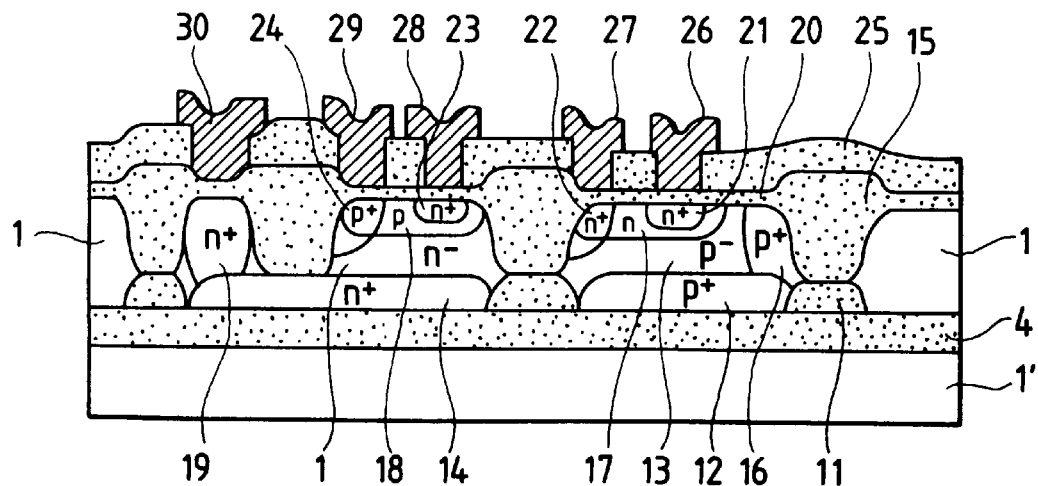
FIG. 5 is an illustrative sectional view of a bipolar transistor as a semiconductor device according to the present invention.

FIG. 5 is an illustrative sectional view for explaining a semiconductor device used in the present invention.

An SiO$_2$ layer 4 is formed on a monocrystalline semiconductor body 1', and a monocrystalline semiconductor layer 1 is formed on the SiO$_2$ layer 4. First selective oxidation regions 11 serving as first. insulating regions are formed on the lower surface of the layer 1. A p$^+$-type region 12 and an n$^+$-type region 14 are formed on the SiO$_2$ layer 4, and a p$^-$-type region 13 is formed on the p$^+$-type region 12. Second selective oxidation regions 15 serve as second insulating regions. The structure in FIG. 5 also includes a p+-type region 16, an n-type region 17, a p-type region 18, an n+-type region 19, an oxide film 20, a p+-type region 21, an n+-type region 22, an n+-type region 23, a p+-type region 24, a surface oxide film 25, and Al electrodes 26 to 30.

In this structure, the following effects can be obtained.

① The n⁻-type region 1 constituting the collector of an npn transistor is connected to the Al electrode 30 through the n⁻-type region 14 and the n+-type region 19, so that a collector potential can be extracted with a low resistance.

② The npn and pnp transistors are electrically insulated and isolated from each other by the second selective oxidation regions 15 formed from the upper surface side of the monocrystalline layer 1 and the first selective oxidation regions 11 formed from the lower surface side of the monocrystalline layer 1. For this reason, as compared with a case wherein a selective oxidation region film is formed from the upper surface to perform isolation, the oxidation region is not spread, and the isolation region can be reduced.

③ Since the epitaxial layer (monocrystalline Si layer) 1 is formed on the insulating surface, its film thickness and the parasitic capacitance can be reduced. In addition, a high-speed operation can be performed since a graded collector structure is employed.

The impurity profile of the collector buried layer 102 shown in FIG. 1 is different from that of the collector buried layer 14 shown in FIG. 5. A good inclined collector structure with good controllability can be obtained in which the impurity concentration toward the base direction is gradually decreased.

Embodiment 1

Figure 6:
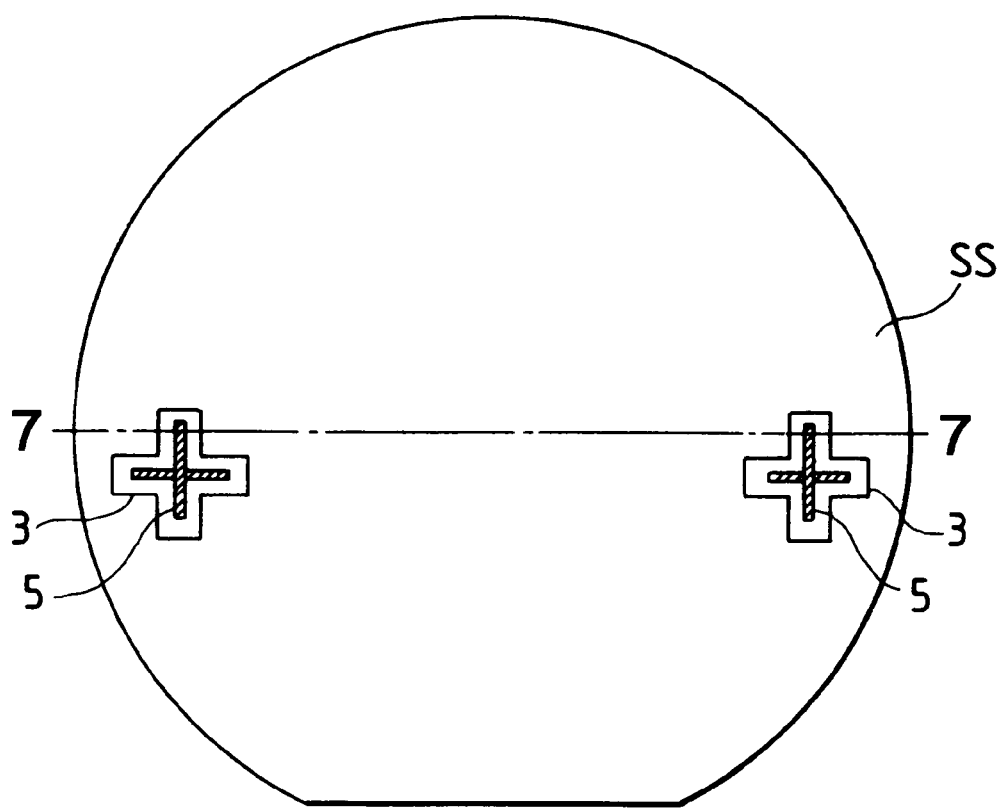
FIG. 6 is an illustrative plan view of a semiconductor device according to Embodiment 1 of the present invention.
Figure 7:
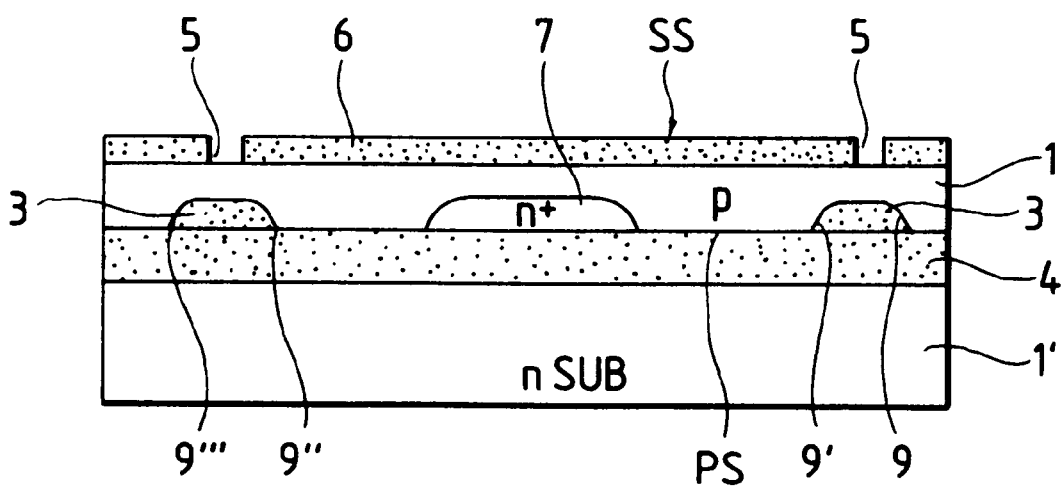
FIG. 7 is an illustrative sectional view of the semiconductor device shown in FIG. 6 along the line BB'.

According to Embodiment 1, FIG. 6 is an illustrative plan view of a structure when viewed from a new upper surface SS of the second wafer after a first wafer 1' and a second wafer are bonded to each other. The new surface SS of the second wafer is covered with an oxide film 6. Alignment marks 3 are formed in a connecting region between the first and second wafers. Alignment marks 5 are formed in the upper surface of the second wafer. As can be apparent from FIG. 6, the marks 3 are aligned with the marks 5, and information of the internal structure can be obtained upon detection of the marks 3. FIG. 7 shows the section of the structure shown in FIG. 6 along the line BB' thereof.

A monocrystalline Si region 1 constitutes the second wafer. A structural body 7 is formed inside the monocrystalline region of the second wafer. In this embodiment, the structural body 7 is an n+-type impurity diffusion layer. An oxide film 4 is formed on the upper surface of the first wafer. An interface PS defines the bonding surface between the first and second wafers. As is apparent from FIG. 7, oxide layer regions represented by reference numeral 3 are formed on the PS side of the thin Si layer 4.

The thickness of the thin Si layer 4 is as small as about 1,000 to 2,000 Å, and the oxide layer regions 3 can be optically detected from the upper surface SS side. In this embodiment, oxide layer edges 9, 9', 9", and 9'" detected from the upper surface with an He—Ne laser, the alignment marks on the mask are set to fall inside the edge lines constituted by the above edges, and the alignment marks are patterned. The alignment marks 5 corresponding to the underlying marks can be formed on in the upper surface of the Si layer, as shown in FIG. 6. When a structural body is to be formed in the upper surface of the Si layer, alignment is performed with reference to the alignment marks 5. For example, alignment between the upper structural body and the impurity diffusion layer 7 serving as the structural body formed on the interface PS between the Si layer 1 and the SiO₂ layer 4. This embodiment exemplifies a structure including the oxide layer shown in FIG. 7. However, this oxide layer may be omitted.

(Manufacturing Method)

A method of manufacturing the structural body according to Embodiment 1 will be described in more detail with reference to FIGS. 8A1 and 8A2, FIGS. 8B1 to 8B4, and FIGS. 8C1 and 8C2.

As shown in FIG. 8A1, an n-type Si wafer 1' is used as the first body. An oxide film 4 is formed on the surface of the n-type wafer, as shown in FIG. 8A2.

On the other hand, a p-type wafer 1 is used as the second body, as shown in FIG. 8B1. Thick SiO₂ layers 3 and a thin SiO₂ layer 34 having a thickness smaller than the layers 3 are formed on the surface of the p-type Si wafer 1, and ion implantation is performed through a resist mask 35 to form an impurity diffusion layer 7. After annealing is performed to activate the impurity, SOG (Spin on Glass) is laid down to cast the entire surface and is reflowed to planarize the surface. After this planarization, the SiO₂ is etched until an interface PS between Si and SiO₂ is exposed, thereby obtaining a structural body as shown in FIG. 8B4. Referring to FIG. 8B4, oxide regions 3 of the lower oxide films left out of the thick oxide film serve as alignment marks. When the flatness of the surface PS is not satisfactory, the surface can be slightly polished to improve flatness.

Figure 4:
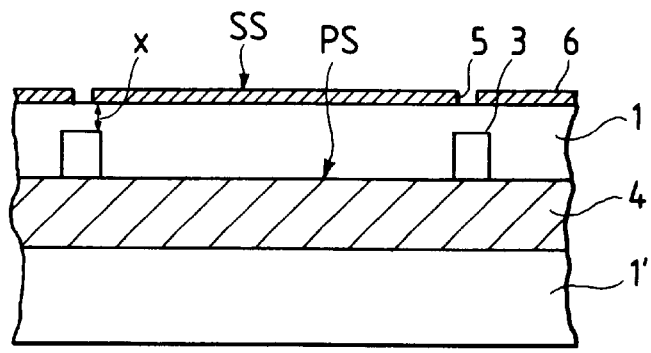
FIG. 4 is an illustrative sectional view of the semiconductor device along the line AA' in FIG. 3.

The upper surface having the SiO₂ layer 4 shown in FIG. 8A2 is bonded to the upper surface PS shown in FIG. 8B4, and the resultant structure is annealed in an N₂ atmosphere at 950° C. for 2 hours, as shown in FIG. 8C1. These surfaces are perfectly bonded to each other at the interface PS. The Si wafer 1 is polished until a desired Si film thickness is obtained. The upper surface is thermally oxidized to form an oxide layer 6, thereby obtaining the structural body of this embodiment.

Embodiment 2

Embodiment 2 of the present invention will be described with reference to FIG. 9. FIG. 9 is a plan view of a wafer when viewed from the top according to Embodiment 2. An alignment structural body 3 is formed on a bonding surface PS between the first and second wafers. An alignment structural body 5 is formed on a surface SS of the first wafer. The alignment structural body 3 or 5 does not have a cross-shaped structure but a V-shaped structure constituted by two marks. In this manner, the shape of marks constituting the lower structure need not overlap that constituting the upper structure if these shapes allow alignment.

Embodiment 3

Embodiment 3 of the present invention will be described with reference to FIG. 10. FIG. 10 shows an SOI high-speed bipolar element.

An n+-type diffusion layer as a collector 19 is connected to an n+-type buried layer 14 and a collector electrode 30. A field oxide film 15 is formed to isolate one element region from another element region. An insulating interlayer 25 can consist of, e.g., BPSG. The bipolar transistor has a p-type base 18 and an n+-type emitter 23, and collector, emitter, and base electrodes 30, 28, and 29.

As can be apparent from FIG. 10, the n+-type buried layer 14 is a diffusion layer formed from an Si surface PS side. Alignment between this diffusion layer and the upper structural body (e.g., the emitter 23, the base 18, the collector 19, and the field oxide film 15) is performed with reference to alignment masks 3 formed in the bonding surface PS region.

In the bipolar transistor of this structure, the distance between the base 18 and the n⁺-type buried layer 14 is determined by the thickness of an Si layer 1, and the impurity profiles of the base 18 and the n⁺-type buried layer 14. Since the n⁺-type buried layer 14 is formed from the exposed surface PS before the substrates or wafers are bonded, i.e., the n⁺-type buried layer 14 is not formed from a surface SS, the impurity profile of the n⁺-type buried layer 14 can be precisely controlled. In addition, as described above, if an epitaxial layer is used as the Si layer 1, its film thickness can also be precisely controlled, thereby reducing the distance between the base and collector and hence achieving a high-speed operation.

Note that contact holes formed in an insulating layer 25 are aligned with reference to alignment marks 5, and the electrodes 28, 29, and 30 are aligned with reference to marks 5'.

In addition, a graded collector structure (i.e., a structure in which the collector impurity concentration is decreased from the collector to the base layer) is preferable to achieve a high-speed operation. In this embodiment, since formation of the base layer can be performed independently of formation of the collector layer, an optimal inclined collector structure can be easily realized, and element characteristics can be improved.

Embodiment 4

Figure 11:
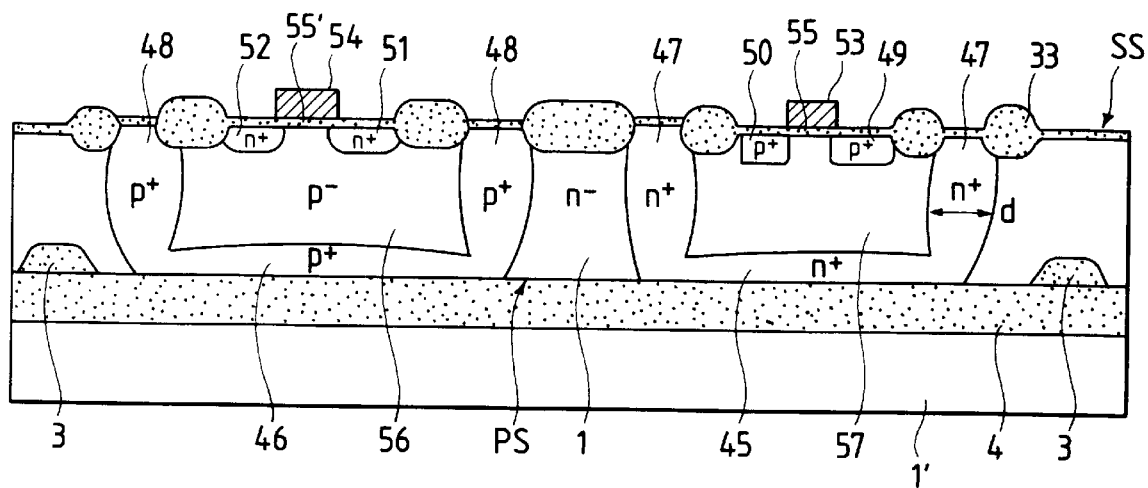
FIG. 11 is an illustrative sectional view showing a semiconductor device according to Embodiment 4 of the present invention.

Embodiment 4 of the present invention will be described with reference to FIG. 11. FIG. 11 shows a complementary MOSFET to which the present invention is applied.

An n⁺-type buried layer 45 sets the potential of an n⁻-type well layer 57 of a PMOS transistor. On the other hand, a p⁺-type buried layer 46 sets the potential of a p⁻-type well layer 56 of an NMOS transistor. An n⁺-type diffusion layer 47 is connected to the n⁺-type buried layer 45. A p⁺-type diffusion layer 48 is connected to the p⁺-type buried layer 46. These diffusion layers 47 and 48 may be formed from an upper surface SS in FIG. 11, but are formed by a method also using a technique of forming the diffusion layers 47 and 48 as in the buried layers 45 and 46 while the interface PS is exposed. If the method also using the above technique is employed, the width d of the diffusion layer can be reduced to almost half that of the conventional technique for forming a diffusion layer from one direction, thereby achieving further micropatterning the element.

The structure shown in FIG. 11 also includes p⁺-type source and drain layers 49 and 50 of a PMOS transistor, a gate electrode 53 of the PMOS transistor, n⁺-type source and drain layers 51 and 52 of an NMOS transistor, and a gate electrode 54 of the NMOS transistor.

Embodiment 5

Figure 12:
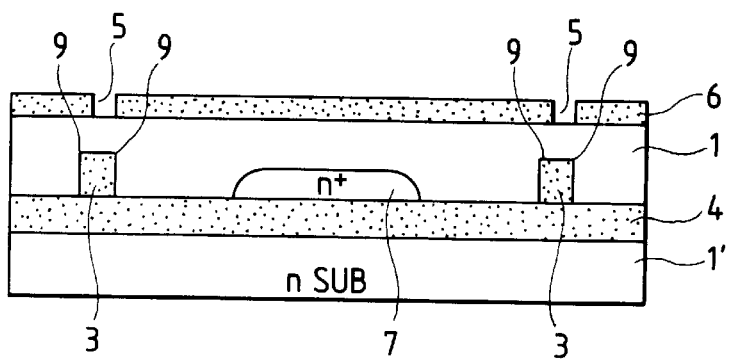
FIG. 12 is an illustrative sectional view showing a semiconductor device according to Embodiment 5 of the present invention.

Embodiment 5 according to the present invention will be described with reference to FIG. 12. In this embodiment, a vertical groove shown in FIG. 12 is formed by dry-etching Si, and SiO₂ is buried in the groove to form lower alignment marks 3.

By employing the structure of this embodiment, edges 9 of the alignment marks 3 become sharp to improve alignment precision. SiO₂ is buried in the groove in FIG. 12. However, the groove may be kept hollow.

Embodiment 6

Figure 13:
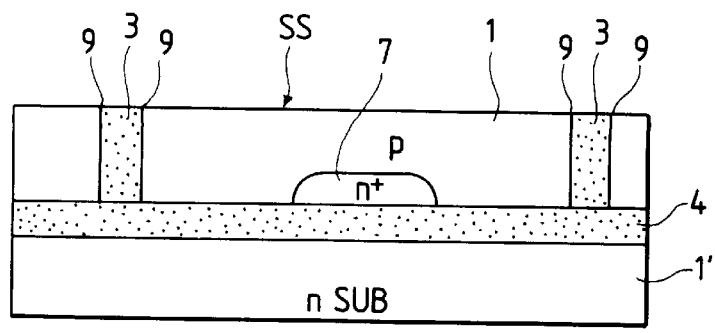
FIG. 13 is an illustrative sectional view showing a semiconductor device according to Embodiment 6 of the present invention.

Embodiment 6 will be described with reference to FIG. 13.

In this embodiment, deep grooves are formed by dry-etching Si, and then a surface SS is polished. Alignment marks 3 are formed to extend throughout the deep grooves and are exposed on the new upper surface. In this case, SiO₂ is buried in the groove for the alignment marks 3. SiO₂ need not be buried in the groove as in Embodiment 5.

In this embodiment, since the lower alignment marks are exposed on the new upper surface, detection precision of edges 9 thereof can be further improved, and hence alignment precision can be further improved.

Embodiment 7

Figure 14:
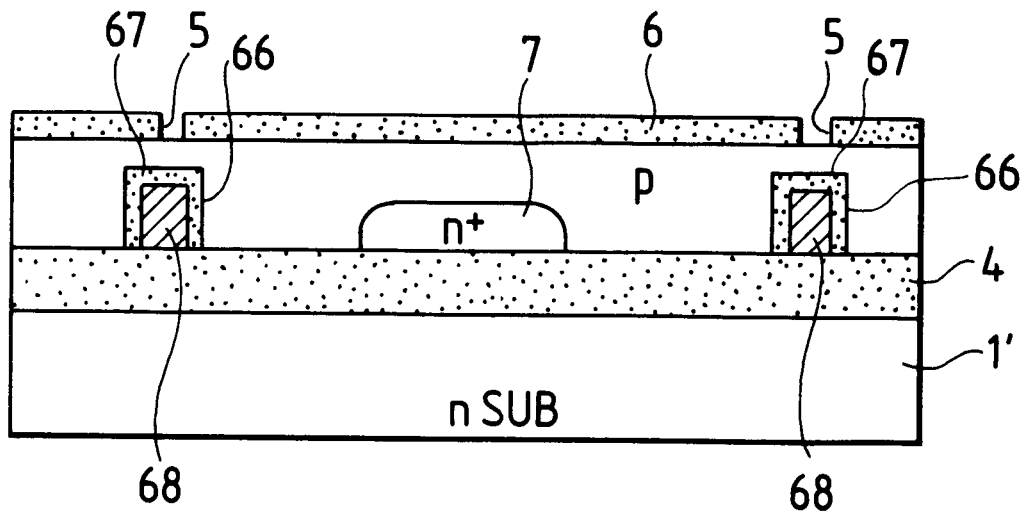
FIG. 14 is an illustrative sectional view showing a semiconductor device according to Embodiment 7 of the present invention.

Embodiment 7 will be described with reference to FIG. 14. The lower alignment structural body up to Embodiment 6 is a solid body filled with SiO₂ or a hollow body. However, in this embodiment, groove surface regions 66 are covered with oxide films 67, and polysilicon 68 is buried inside the grooves. This facilitates filling inside the groove, and an alignment mark having a smaller width can be formed.

Embodiment 8

Figure 15:
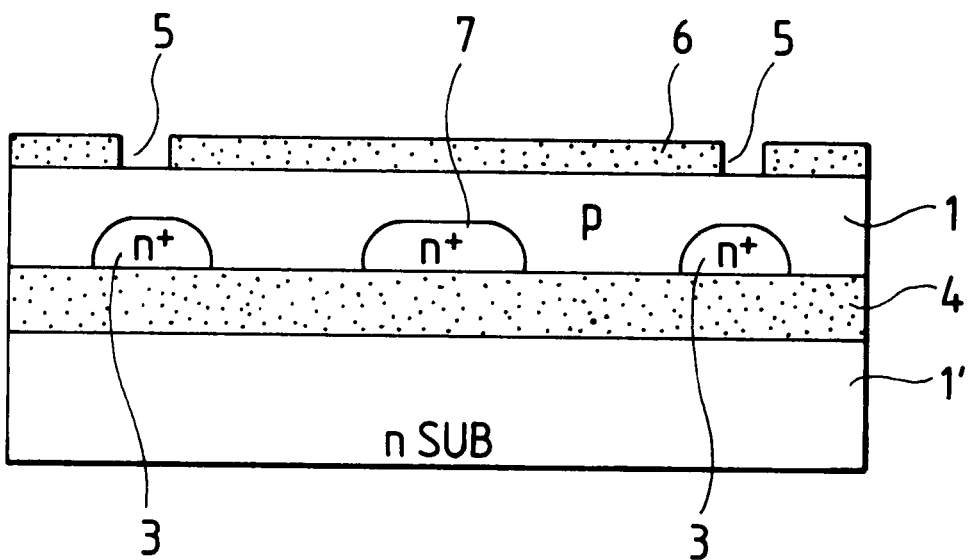
FIG. 15 is an illustrative sectional view showing a semiconductor device according to Embodiment 8 of the present invention.

Embodiment 8 will be described with reference to FIG. 15. The alignment mark is detected by an optical signal using a difference in refractive index or film thickness up to Embodiment 7. However, in this embodiment, regions each having an impurity concentration profile different from that of the surrounding region are formed as alignment marks 3. The impurity profile can be detected with an infrared-ray as light.

When this method is used, the alignment marks 3 are formed upon formation of an impurity profile region 7 as a lower structural body, and the number of steps can be reduced. Since the alignment masks 3 and the region 7 are formed using the same mask, alignment precision can be further improved.

Embodiment 9

In this embodiment, a semiconductor device having a structure identical to that in Embodiment 1 is manufactured using a new and improved manufacturing process. Operations different from those of Embodiment 1 are a method of processing the second wafer and a process upon bonding between the first and second wafers. As shown in the step of FIG. 16B1, a p-type monocrystalline Si wafer 70 is prepared.

As shown in the step of FIG. 16B2, the monocrystalline Si wafer 70 is anodized to obtain a porous Si wafer 71.

Anodization is preferably performed using an anodization solution containing HF, H₂O, and C₂H₅OH at a ratio of 1:1:1 under the conditions that an applied voltage is 2.6 V and a current density is 30 A/cm². A p-type epitaxial layer 1 is formed on the porous Si wafer 71 obtained as shown in the step of FIG. 16B3 by epitaxial growth. In this case, molecular beam epitaxy is preferably performed at a temperature of 700° C., a pressure of 1×10⁻⁹ Torr, and a growth rate of 0.1 nm/sec.

Thick oxide films 3 and a thin oxide film 34 are formed on the surface of the p-type epitaxial layer 1 by selective oxidation in the same manner as in Embodiment 1. An impurity diffusion layer 7 serving as a structural body is formed on the side of an oxide film 34. As shown in the step of FIG. 16B5, the surface is planarized by etching or the like.

After this planarization, the surface of the first wafer separately prepared is caused to face the planarized surface, and these surfaces are bonded by annealing. Thereafter, the porous layer or wafer 71 can be removed by an etching solution to obtain a desired structure.

This etching step is performed in detail as follows.

The bonded body is selectively etched using a solution mixture of buffered hydrofluoric acid (HF: 4.46%, NH$_4$F: 36.2%) and a 30% hydrogen peroxide solution (1:5). When about 191 minutes have elapsed, only the monocrystalline Si layer is left unetched. The porous Si wafer is selectively and perfectly etched using monocrystalline Si as an etching stopper.

The etching rate of the etching solution for the nonporous monocrystalline Si is as very low as 50 Å or less with the lapse of 191 minutes. The selectivity ratio of the nonporous monocrystalline Si to the porous layer reaches $10^5$ or more. The etching amount (several tens of Å) of the nonporous layer is negligible in practice. That is, the porous Si substrate or wafer having a thickness of 200 µm is removed, and a monocrystalline Si layer having a thickness of 0.5 µm can be formed on SiO$_2$. According to this method, no new crystal defects are formed in the Si layer and good crystallinity can be maintained as a result of sectional observation with a transmission electron microscope.

Embodiment 10

Figure 17:
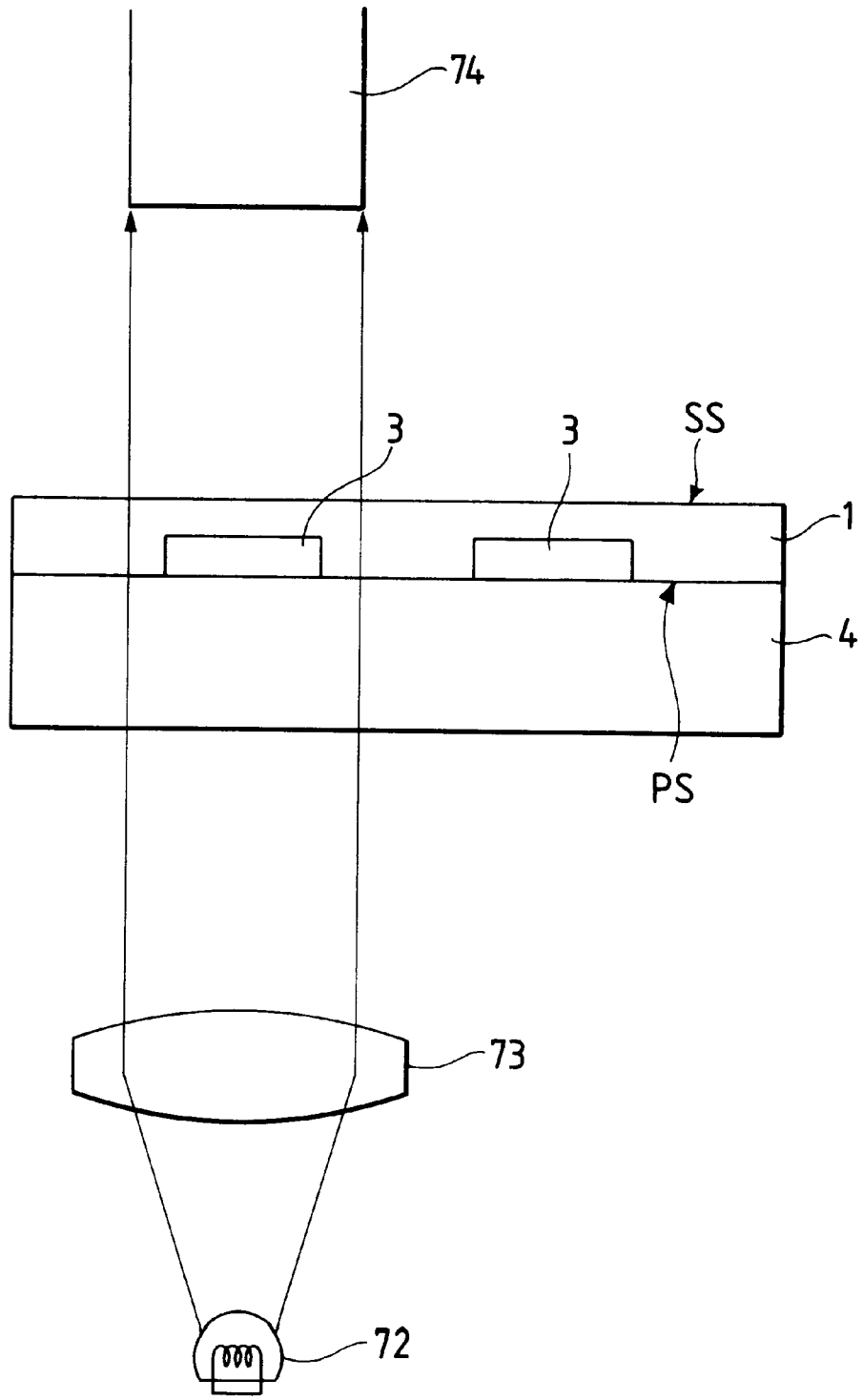
FIG. 17 is an illustrative view for explaining alignment of a semiconductor device according to Embodiment 10 of the present invention.

A semiconductor device having an SOI (Silicon On Insulator) structure according to Embodiment 10 will be described with reference to FIG. 17.

Using a resist (not shown), a desired pattern is formed on an n-type monocrystalline silicon substrate having a resistivity of 10 to 20 Ω·cm. Arsenic (As) ions are implanted in the substrate using this resist pattern as a mask at a dose of $1 \times 10^{15}$ ions/cm$^2$ and an acceleration energy of 60 keV. After the resist pattern is removed, the resultant structure is driven in an N$_2$ atmosphere at 1,100° C. for 120 minutes to form n-type heavily doped buried layers 3. An insulating substrate 4 made of transparent glass or the like is bonded to a surface PS having the buried layers 3 of the monocrystalline silicon substrate 1. Annealing is performed at 1,000° C. for about 60 minutes to firmly bond the silicon substrate 1 and the insulting substrate 4. The substrate 1 is machined by cutting, polishing, or the like to obtain a monocrystalline layer having a thickness of about 0.5 to 8 µm. A resultant SOI substrate 11 has the heavily doped buried layers 3.

Elements such as a MOS transistor, a bipolar transistor, a capacitor, and a resistor are to be formed in the monocrystalline layer by a normal method of manufacturing a monolithic IC. No three-dimensional pattern representing the positions of the heavily doped buried layers 3 is formed on the surface of the SOI substrate. The insulating substrate is irradiated with an infrared-ray (or a far-infrared-ray) having a wavelength of 5 to 50 µm from a lamp 72 located on the insulating substrate side through a lens 73. A light-receiving portion 74 is arranged to detect the intensity of the infrared-ray passing through the SOI substrate. Since the intensity of the infrared-ray is reduced to ½ to ⅒ in the heavily doped region in the monocrystalline layer as compared to a decrease in intensity in a lightly doped monocrystalline layer, the position of each heavily doped buried layer in the monocrystalline layer can be detected. The detection position of the buried layer is aligned with the mask position, and a pattern is formed on the surface of the SOI substrate, so that alignment marks are formed in the surface SS. Therefore, mask alignment can be performed in accordance with a conventional alignment method.

In the above embodiment, the insulating substrate bonded to the monocrystalline silicon substrate is made of transparent glass. However, a substrate obtained by forming an insulating film on a monocrystalline silicon substrate can be dealt in the same manner as the transparent glass if an impurity concentration in silicon is $5 \times 10^{16}$/cm$^3$ or less.

As described above, a difference in transmittance is detected in accordance with a difference in impurity concentration in a substrate, using light having a long wavelength which can pass through the substrate. The substrate is aligned with the mask. Therefore, substrates having no three-dimensional patterns or differences in reflectance can be aligned with a mask.

Embodiment 11

The steps in manufacturing a semiconductor device according to Embodiment 11 will be described with reference to FIGS. 18A to 18D.

A 1-µm thick n-type epitaxial layer 1 is grown on a p-type silicon wafer 70.

Figure 18A:
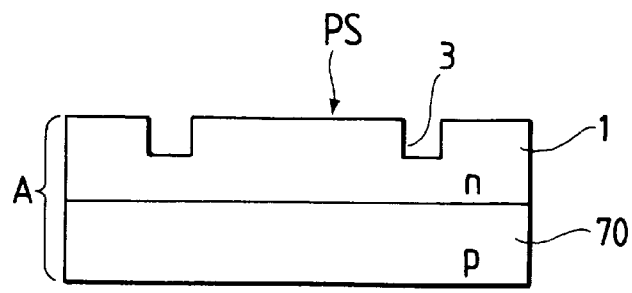
FIGS. 18A to 18D are illustrative sectional views for explaining a method of manufacturing a semiconductor device according to Embodiment 11 of the present invention.
Figure 18B:
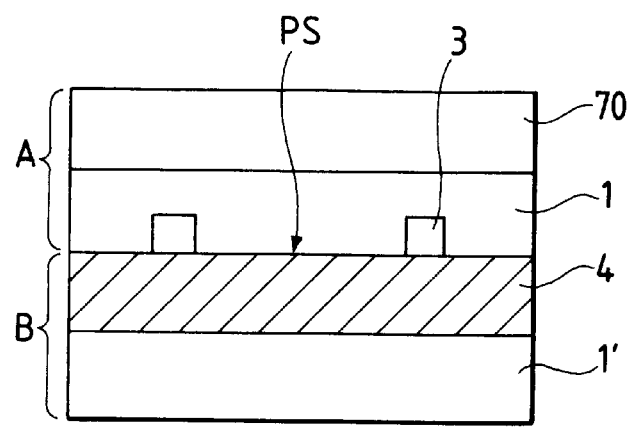

Recesses 3 each having a depth of 5,000 Å and serving as an alignment mark are formed in the surface of the n-type epitaxial layer 1 by RIE (the step in FIG. 18A).

A substrate obtained by thermally oxidizing the surface of a silicon wafer 1' to a thickness of 5,000 Å as a thermal oxide film 4 is prepared as a support substrate B. A surface PS of the n-type epitaxial layer 1 of a substrate A is bonded to the thermal oxide layer of the substrate B, and the resultant structure is annealed at 1,100° C. for 30 minutes, thereby confirming bonding between the substrates A and B. The bonding strength is 2,500 kgt/cm$^2$, which is equal to a substrate having an entire flat surface (the step in FIG. 18B).

Figure 18C:
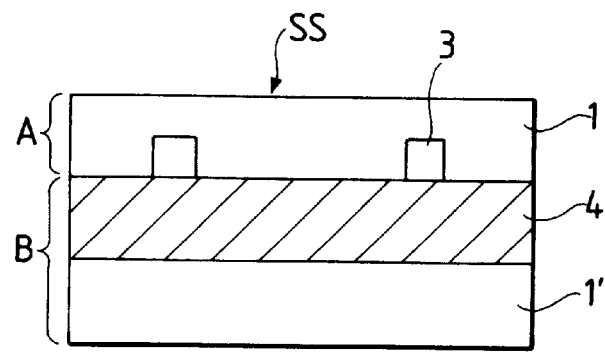
Figure 18D:
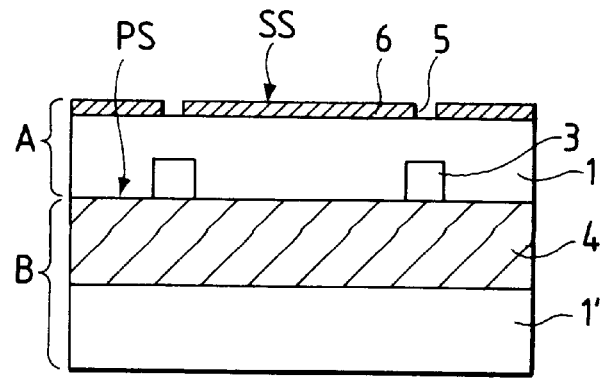

The p-type silicon layer 70 is selectively removed to obtain a structure shown in the step of FIG. 18C.

A 1,000-Å thick thermal oxide film 6 is formed on a second surface SS of the exposed n-type epitaxial layer 1.

Alignment marks 5 are formed in the second major surface SS while being aligned with the alignment marks 3. Since the thickness of the n-type epitaxial layer 1 is 1 µm, the recessed marks 3 can be detected with light having a wavelength of 630 nm. The thermal oxide film 6 is etched with reference to the detected recessed marks 3 to form the alignment marks 5 in the second major surface SS (the step in FIG. 18D).

Although a description of the subsequent steps will be omitted, processing such as diffusion and etching is performed using the alignment marks 5 in the second major surface SS, thereby obtaining excellent matching characteristics.

As an example compared, convex aligning marks each having a height of 5,000 Å are formed of polysilicon. However, floating has occurred near the alignment marks, and good bonding in the above embodiment could not be performed.

Embodiment 12

FIGS. 19A to 19E are sectional views showing the steps in manufacturing Embodiment 12 according to the present invention.

Figure 19A:
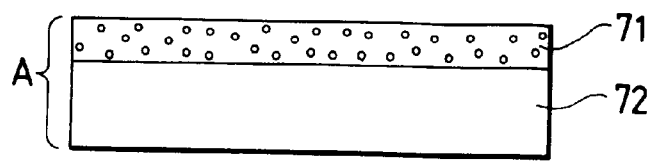
FIGS. 19A to 19E are illustrative sectional views for explaining a method of manufacturing a semiconductor device according to Embodiment 12 of the present invention.

A p-type silicon substrate 72 is anodized to form a 10-µm thick porous silicon layer 71 (the step in FIG. 19A).

Figure 19B:
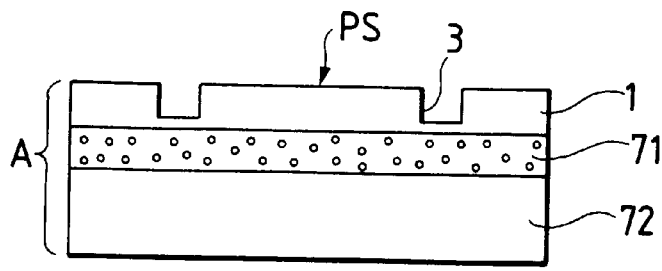

A 1-µm thick n-type epitaxial layer 1 is formed on the porous silicon layer 71 by epitaxial growth, and 5,000-Å deep recesses 3 serving as alignment marks are formed in a surface PS by RIE (the step in FIG. 19B).

A substrate obtained by thermally oxidizing the surface of a silicon wafer 1' is used as a support substrate B.

Figure 19C:
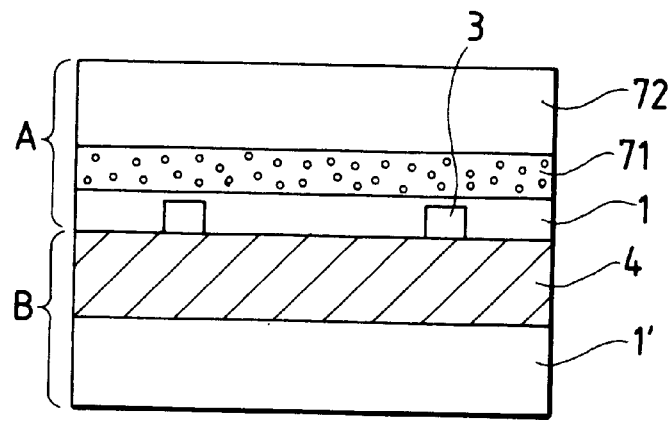

The surface of a thermal oxide film 4 of the support substrate B is bonded to the surface PS of the n-type epitaxial layer 1 (the step in FIG. 19C).

Figure 19D:
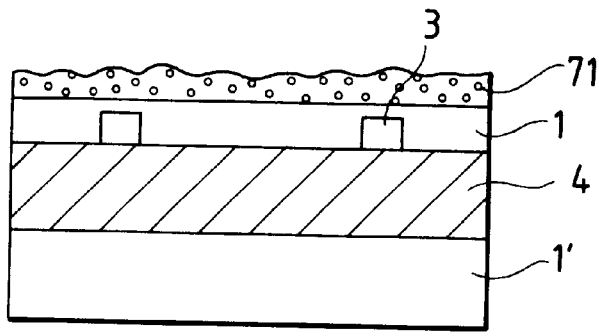

The p-type silicon region or substrate 72 is polished to expose the porous silicon layer 71 (the step in FIG. 19D). At this time, the cutting precision is set to fall within the range of about ±2 to 3 μm.

The remaining porous silicon region 71 is selectively etched with a hydrofluoric acid-based solution.

Figure 19E:
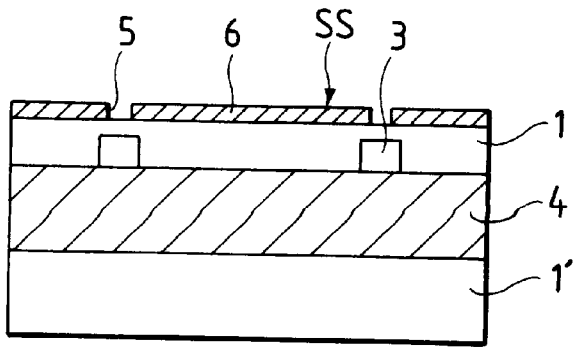

The exposed surface of the n-type epitaxial layer 1 is thermally oxidized to form an oxide film 6, and the oxide film is selectively etched to form regions 5 as alignment marks in a second major surface SS (the step in FIG. 19E).

A high etching ratio can be obtained by a hydrofluoric acid-based etching solution in etching porous Si and non-porous Si. In this embodiment, since the porous silicon layer 71 is formed on the first body or substrate A, selective etching with high precision can be performed, and an SOI layer having a uniform thickness can be obtained. At this time, a typical hydrofluoric acid-based solution used as the selective etching solution is a solution mixture of hydrofluoric acid, hydrogen peroxide, and alcohol.

Embodiment 13

Figure 20A:
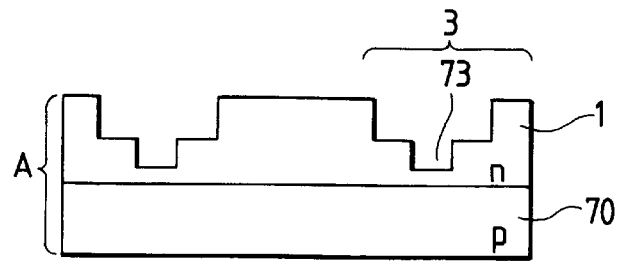
FIGS. 20A and 20B are illustrative sectional views for explaining a method of manufacturing a semiconductor device according to Embodiment 13 of the present invention.
Figure 20B:
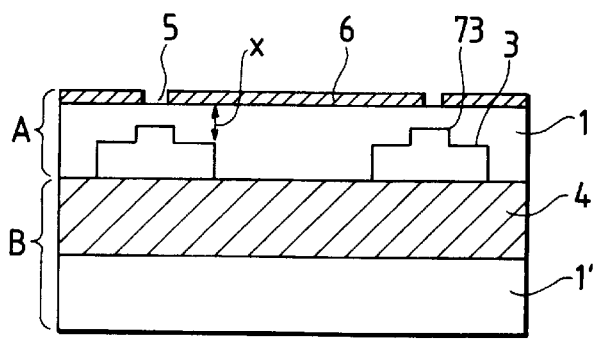

Embodiment 13 will be described with reference to FIGS. 20A and 20B. The manufacturing steps in this embodiment comply with those of Embodiment 11. The n-type epitaxial layer of Embodiment 11 corresponds to a layer 1 in FIGS. 20A and 20B. This epitaxial layer 1 has a thickness of 2 μm, and 1-μm deep recesses 3 are formed as regions for forming alignment marks in the surface of the epitaxial layer 1 by RIE. 5,000-Å deep recessed marks 73 are formed as the alignment marks in the recessed regions 3 (the step in FIG. 20A).

The resultant structure is bonded to a body B following the same procedures as in Embodiment 11.

Following the same procedures as in Embodiment 11, the second major surface opposite the surface having the recessed marks 73 is processed on the basis of the recessed marks 73, thereby forming alignment marks 5 in the second major surface. In this embodiment, since the thickness of the n-type epitaxial layer is 2 μm, light is almost absorbed in silicon by the means shown in Embodiment 11.

In Embodiment 13, all the regions in which the alignment marks 73 are present are recessed to reduce the film thickness, and the alignment marks 73 are formed in the regions 3.

If the film thickness of the entire regions in which the alignment marks are present is not reduced, the bottom surfaces of the recessed alignment marks 73 must be deep enough to allow light transmission. That is, etching must be performed to a depth of 1.5 μm. In this case, an overhang or the like may be formed to tend to degrade the processing precision.

In this embodiment, an He—Ne laser is used as a light source for detecting the alignment marks 73, and the light absorption coefficient of the laser beam is 3.5E3 cm$^{-1}$. In FIG. 20B, χ is 1 μm, so that α×(2χ)=0.7. Light can be satisfactorily transmitted.

Convex alignment marks may be formed in the recesses 3 serving as the alignment mark regions and can be detected by the same method as described above. For this reason, deposition films may be used for the alignment marks.

Embodiment 14

Embodiment 14 according to the present invention will be described with reference to FIGS. 21A to 21E, FIGS. 22A and 22B, and FIGS. 23A to 23E.

Figure 22A:
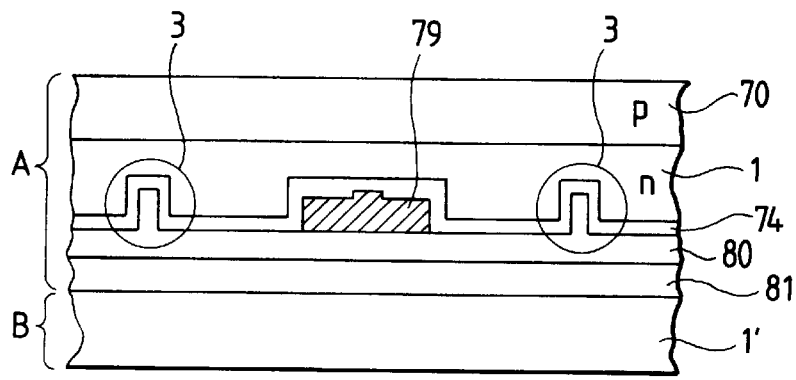
FIGS. 21A to 21E, FIGS. 22A and 22B, and FIGS. 23A to 23E are sectional views for explaining the steps in manufacturing a semiconductor device according to Embodiment 14 of the present invention.
Figure 22B:
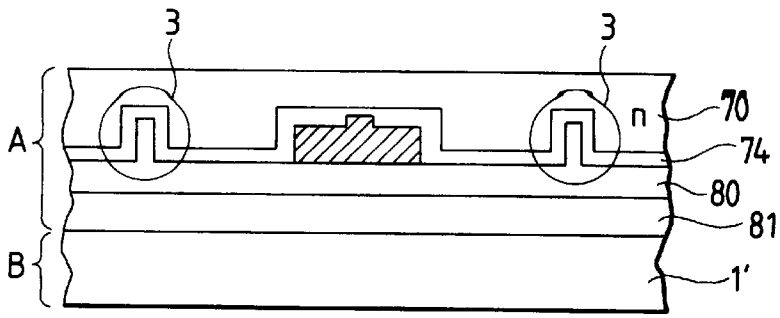

FIGS. 21A to 21E show the steps in forming an underlying surface of a MOS transistor before two wafers are bonded to each other, FIGS. 22A and 22B show the steps in bonding the two wafers, and FIGS. 23A to 23E show steps in processing the surface after the two wafers are bonded to each other.

The steps in processing the underlying surface will be described with reference to FIGS. 21A to 21E.

Figure 21A:
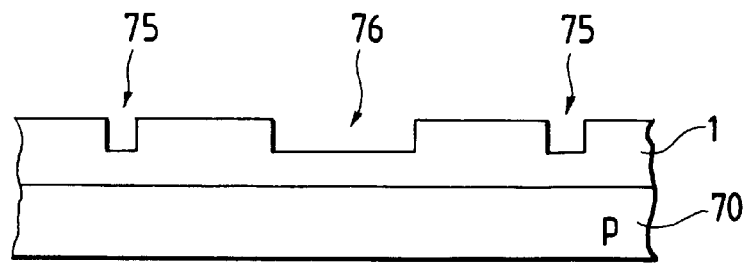
Figure 21B:
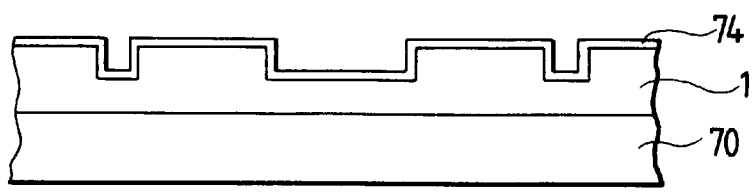

As shown in FIG. 21A, an 8,000-Å thick n-type silicon epitaxial layer 1 is formed on a p-type wafer 70. In order to reduce the film thickness of a region in which a MOS transistor is formed and to form alignment marks, the n-type silicon epitaxial layer 1 is etched to form recesses 75 and 76.

Figure 21C:
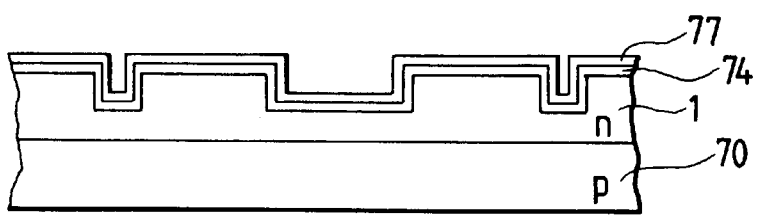

A 1,000-Å thick thermal oxide film 74 is formed (the step in FIG. 21B), and a 600-Å thick CVD-oxide film 77 is deposited thereon (the step in FIG. 21C).

Figure 21D:
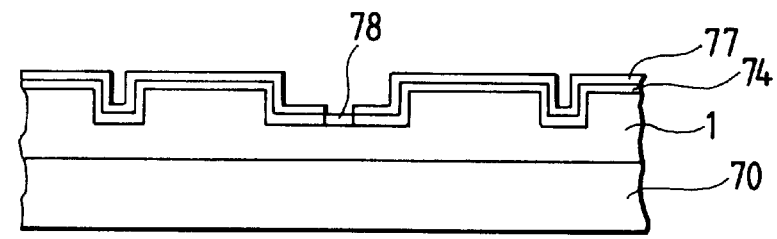
Figure 21E:
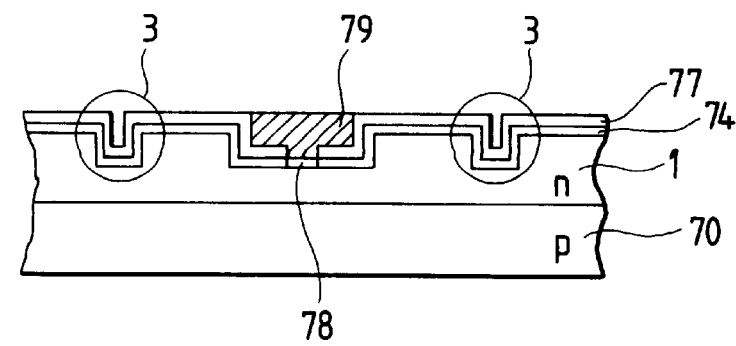

In order to form a gate oxide film and a gate electrode on the lower surface, the oxide film is partially etched, and a 500-Å thick thermal oxide film 78 is formed as the gate oxide film on the lower surface (the step in FIG. 21D).

A polysilicon film 79 as the gate electrode is deposited on the lower surface, and polysilicon except for the MOS formation region is removed. After the surface is planarized, the resultant surface is etched back to obtain a structure shown in the step of FIG. 21E. This structure has alignment marks 3.

The bonding operations will be described with reference to FIGS. 22A and 22B.

An 8,000-Å thick CVD-oxide film 80 and an 8,000-Å thick BPSG film 81 are deposited on the wafer obtained in FIGS. 21A to 21E, and a support substrate 1' is bonded to this wafer through the films 80 and 81. Bonding is performed by 300-V electrostatic compression bonding at 950° C. for 15 minutes to obtain a structure shown in the step of FIG. 22A.

The p-type region 70 is removed by selective etching to obtain a structure shown in the step of FIG. 22B. In this embodiment, since the alignment marks 3 are constituted by recesses, no voids are formed, and a high bonding strength can be obtained.

The surface processing will be described with reference to FIGS. 23A to 23E.

Since the thickness of the silicon layer is 8,000 Å, the alignment marks 3 can be satisfactorily detected with an He—Ne laser. A field oxide film 82 is formed on the basis of the marks 3 (the step in FIG. 23A).

In order to obtain a p-type active layer of a MOS transistor, boron ions (B$^{11}$) are implanted at a dose of 2E12 cm$^{-2}$ and an acceleration energy of 100 keV, and the resultant structure is annealed at 1,000° C. A gate oxide film 83 is formed of a thermal oxide film to a thickness of 500 Å. Polysilicon is deposited as a gate electrode 84. The overall structure is shown in the step of FIG. 23B, and FIG. 23C is an enlarged view of the MOS transistor.

Figure 23D:
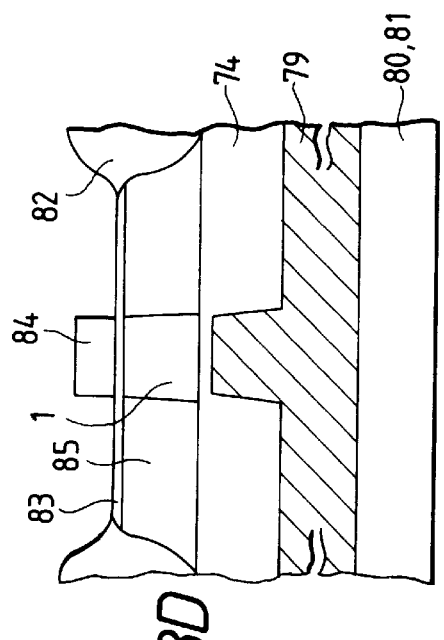

As shown in the step of FIG. 23D, ion implantation is performed to form source and drain regions 85 using the gate electrode 84 as a mask. More specifically, phosphorus ions (P$^{31}$) are used as an ion spices and are implanted at a dose of 5E15 cm$^{-2}$ and an acceleration energy of 100 keV.

Annealing is then performed at 900° C. for 30 minutes to activate the impurity. A through hole (not shown) is formed to extract the potential of the gate electrode 79 on the lower surface.

Figure 23E:
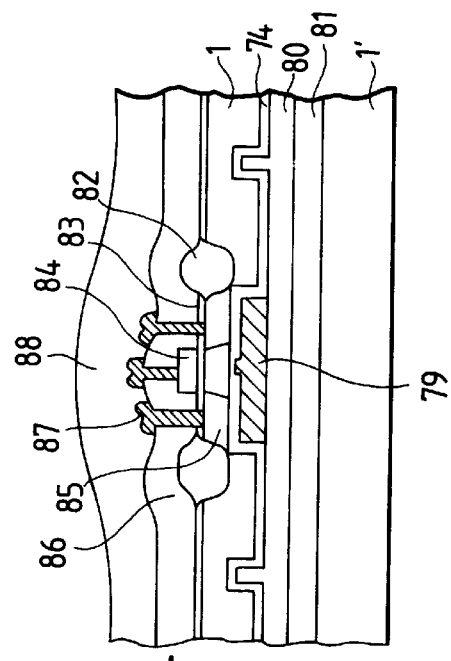
Figure 23A:
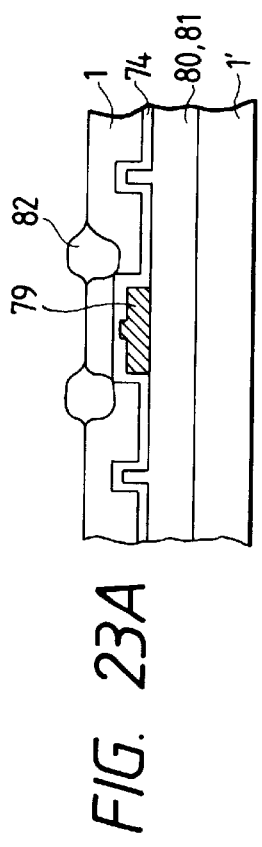
Figure 23B:
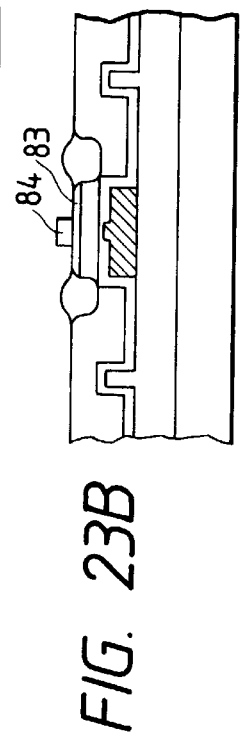
Figure 23C:
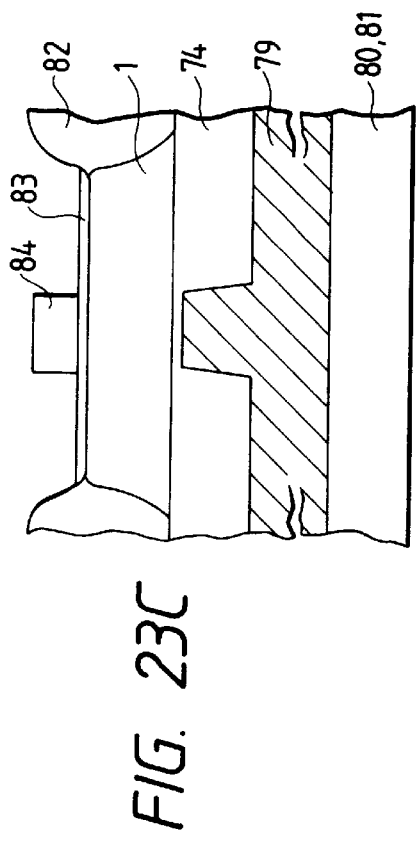

A 6,000-Å thick PSG insulating interlayer 86 is deposited, contact holes are formed, Al 87 is deposited, and a PSG 8,000-Å thick protective film 88 is formed, thereby obtaining the structure shown in the step of FIG. 23E.

Figure 24:
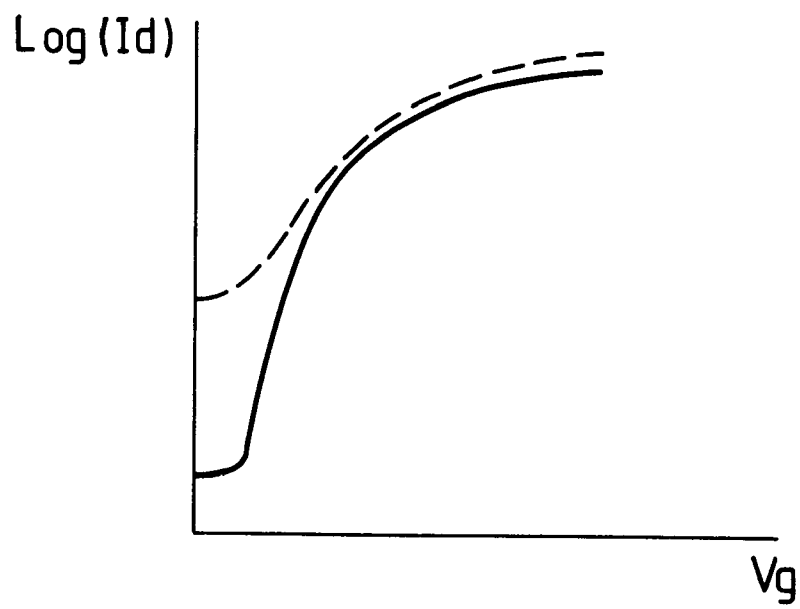
FIG. 24 is a graph showing the characteristics of the semiconductor device of Embodiment 14.

The characteristics of the MOS transistor manufactured in the above process are shown in FIG. 24. The gate length of the MOS transistor of this embodiment is 0.5 μm, and the substrate concentration is 5E15 cm$^{-3}$. As an example compared, a punchthrough phenomenon occurs if a bulk silicon wafer or a MOS transistor having no gate electrode on the lower surface has the above relationship between the gate length and the substrate concentration (dotted curve in FIG. 24). According to this embodiment, a good MOS transistor having no punchthrough can be obtained (solid curve in FIG. 24).

Embodiment 15

A structure shown in FIGS. 22A and 22B is obtained by the bonding technique using porous silicon in Embodiment 12. Thereafter, a MOS transistor structure like Embodiment 14 is obtained through the processes in FIGS. 22A and 22B and FIGS. 23A to 23E of Embodiment 14.

As a result, good MOS transistor characteristics free from punchthrough can be obtained.

Embodiment 16

The alignment mark in each of the above embodiments has a recessed hollow shape in an epitaxial layer. However, this embodiment has an alignment mark structure perfectly extending through an epitaxial layer.

Figure 25:
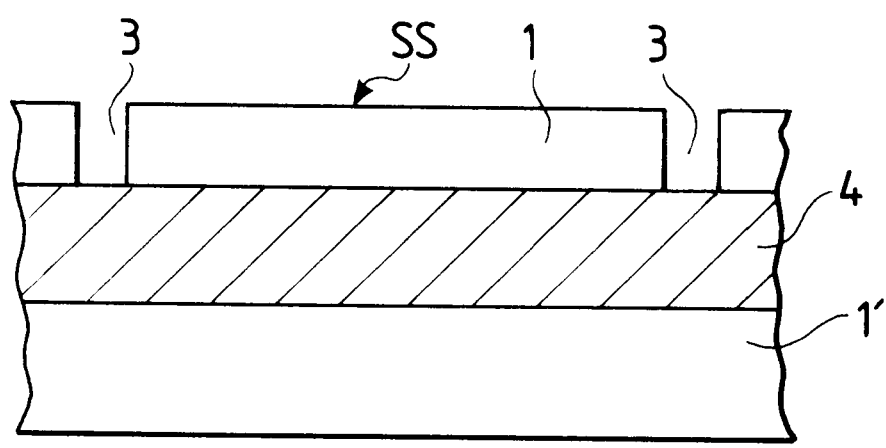
FIG. 25 is an illustrative sectional view showing a semiconductor device according to Embodiment 16 of the present invention.

This embodiment will be described in detail with reference to FIG. 25.

An insulating layer 4 under an Si thin film of an SOI structure is formed on a silicon wafer 1' serving as a support substrate. This insulating layer is not limited to $SiO_2$, but may be an SiON-based insulator, an SiN insulator, or a combination thereof. An Si thin film 1 has a thickness of 0.05 μm to several tens of μm. Alignment marks 3 have a structure extending through the epitaxial layer or the Si thin film 1.

When the epitaxial layer reaching the porous layer is etched by RIE in the same manner as in Embodiment 11, the above structure can be obtained following the same procedures as in Embodiment 11.

In this embodiment, the alignment marks reach a surface SS on which a device is to be formed, and good alignment signals can be obtained, thereby advantageously achieving high precision.

As has been described above, according to Embodiments 11 to 16, in the SOI semiconductor device obtained by the bonding method using the recessed alignment marks, alignment can be accurately performed, and flatness of the bonding surface of the substrate to be bonded can be improved.

In processing the upper and lower surfaces of the semiconductor layer, the upper surface can be accurately aligned with the lower surface to obtain a high-precision semiconductor device.

In order to detect alignment marks on the opposite surface, a distance χ from the bottom portion of the recess constituting each alignment mark to the second major surface is set to satisfy the following condition:

$$\alpha \times (2\chi) \leq 1$$

where α is the light absorption coefficient of the semiconductor layer within the distance χ.

Therefore, light can pass through only the recesses serving as the alignment marks, thereby performing high-precision detection.

Embodiment 17

As shown in FIGS. 26A to 26D, a p-type silicon substrate 1 containing an impurity having a concentration of about $1 \times 10^{12}$ to $10^{16}$ cm$^{-3}$ is oxidized by 5,000 Å, and reference alignment marks 93 are formed in a lower surface SS by the photolithographic process. The alignment marks are formed using an apparatus capable of performing exposure on both surfaces of the wafer. More specifically, a protective resist is coated on the surface of the wafer, and a resist is then coated on the lower surface of the wafer. The alignment marks are transferred to the lower surface of the wafer using two-side exposure machine, and the wafer is etched to form the reference alignment marks 93 (the step in FIGS. 26A).

The oxide film is removed from the entire surface, and oxidation is performed again to a thickness of 7,000 Å. Wafer alignment is performed using the reference alignment marks 93 formed in the lower surface. A pattern corresponding to a portion for forming a collector buried layer 7 is transferred to the upper surface of the wafer, and the oxide film is etched to form a 1,000-Å thick silicon oxide film.

Arsenic (As) ions are implanted to form the 5-μm thick n-type collector buried layer 7 having a concentration of $1 \times 10^{19}$ cm$^{-3}$ or less by thermal oxidation. At this time, the sheet resistance is set to 30 Ω/□ or less. Thereafter, the thermal oxide film is removed from the entire surface (the step in FIG. 26B).

A 5,000-Å thick thermal oxide film 4 is formed on a silicon wafer 1' serving as the body of the SOI substrate. The wafer 1' is set to overlap a surface PS of the wafer 1 which has the n-type collector buried layer 7, and the resultant structure is annealed at 800° C. for 30 minutes, thereby firmly bonding the two silicon wafers (the step in FIG. 26C).

Marks 94 corresponding to the reference alignment marks 813 first formed in the photolithographic process are formed in the lower surface of the wafer 1' serving as the body of the SOI substrate. The marks 94 are formed in the same manner as the reference alignment marks. That is, the wafer is oxidized, the resist is coated thereon, the wafer is aligned using the reference alignment marks on the lower surface, exposure is performed on the upper surface of the wafer, and etching is performed to form the alignment marks 94 (the step in FIG. 26D).

The marks 94 are used as the reference marks in the subsequent process. In order to minimize the offsets between the upper and lower surfaces, in pattern transfer, alignment is performed using a light source on the upper surface side, while exposure is performed using a light source on the lower surface side.

The silicon wafer 1 having the buried region is ground from the lower surface SS thereof by a mechanical grinder so that the remaining silicon thickness becomes 20 μm. In this case, the reference alignment marks 93 formed first are removed.

Figure 27E:
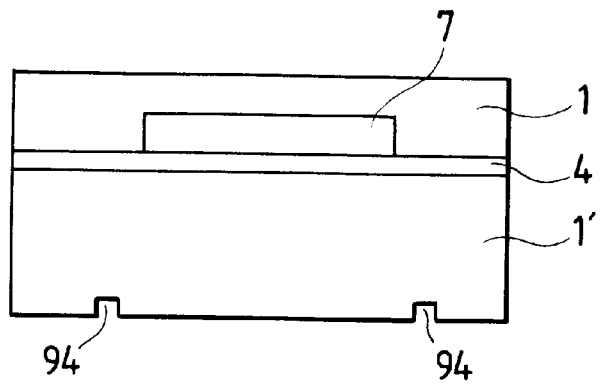
FIGS. 27E to 27H are illustrative sectional views for explaining the steps in manufacturing a semiconductor device according to Embodiment 17.
Figure 27F:
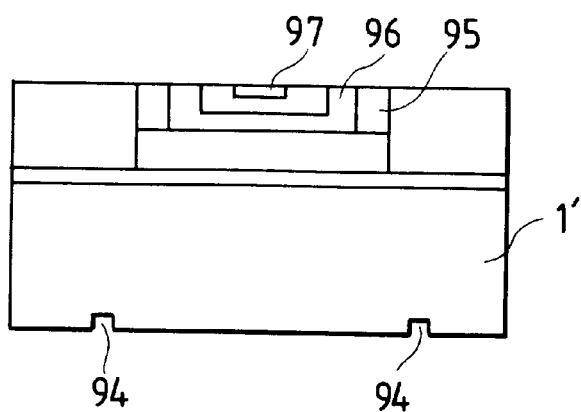

Referring to FIGS. 27E to 27H, chemical etching is performed to finally obtain a silicon thickness of 8 μm, thereby obtaining the SOI substrate having the n-type buried region 7 (the step in FIG. 27E).

An 8,000-Å thick thermal oxide film is formed, P (phosphorus) ions are implanted, this impurity is thermally diffused, and an n-type collector region 95 reaching the n-type buried region is formed. At this time, the sheet resistance is set to be 10 Ω/□ or less.

A base region is pattered within a region surrounded by the n-type collector region 95. Ion implantation and thermal diffusion are performed to form a base region 96. In addition, an emitter region 97 is formed (the step in FIG. 27F).

Figure 27G:
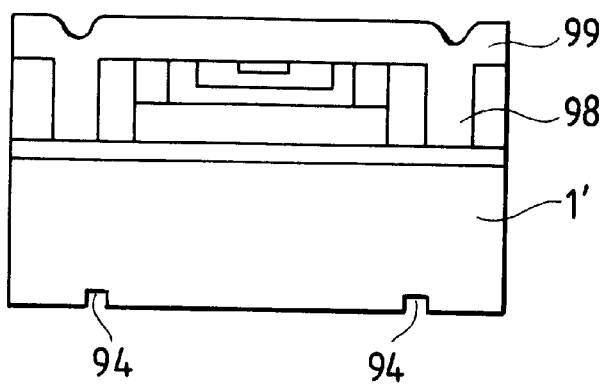

An isolation groove 98 is filled with a CVD film 99 to reach an oxide film defined by the groove 98 so as to surround the n-type collector region 95 (the step in FIG. 27G).

Figure 27H:
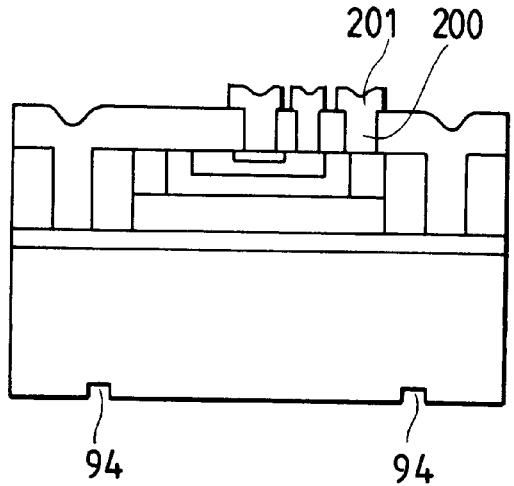

Thereafter, contact holes 200 for a wiring material are formed, and Al 201 is deposited and patterned (the step in FIG. 27H).

In this manner, a semiconductor element can be formed on the SOI substrate having the buried layer therein.

Figure 28D:
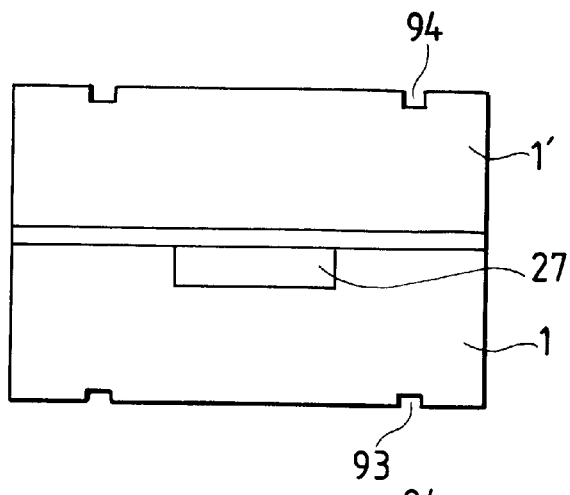
FIGS. 28D to 28F' are illustrative views for explaining other steps in manufacturing the semiconductor device of Embodiment 17.
Figure 28E:
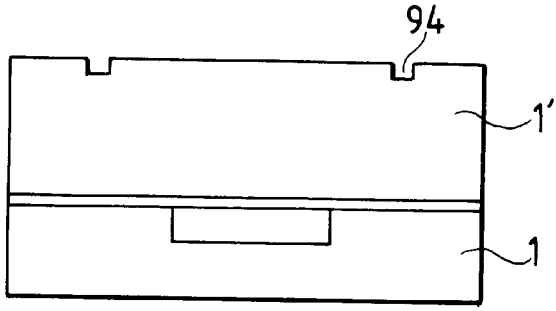
Figure 28F:
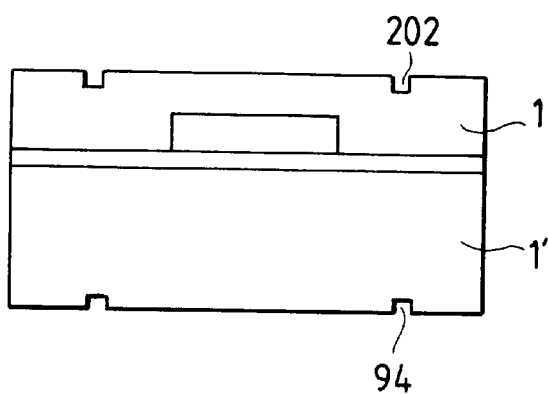

Alignment marks 202 corresponding to the alignment marks 94 formed in the lower surface are formed in the upper surface of the wafer. These marks 202 may be used as the alignment marks in the subsequent steps. FIGS. 28D to 28F' are views for explaining a modification of this embodiment. In the step of FIG. 28F', after the alignment marks 202 are formed in the upper surface of the wafer, these are used as the alignment marks in the subsequent steps, thereby forming an element.

The above embodiment exemplifies the bipolar transistor. However, the present invention is not limited to this. A buried portion need not be a simple buried layer, but may be a device structure.

The substrate serving as the body may be a silicon substrate, an insulating substrate, or a glass substrate according to the present invention, thereby obtaining the same effect as described above.

As described above, according to this embodiment, the reference alignment marks are formed in the lower surface of the wafer, and the marks are formed in the upper surface while being aligned with the reference alignment marks. Therefore, the semiconductor element can be easily formed in the upper surface of the substrate with high precision.

In addition, the wafer bonding temperature is as low as about 800° C., no diffusion of a dopant occurs, and a thin monocrystalline film can be left on the insulating film.

Embodiment 18

A semiconductor device according to Embodiment 18 of the present invention will be described below. In this embodiment, porous Si is used as the starting material of a substrate.

Porous Si was found by Uhlir et al. in the study on electrolytic polishing of a semiconductor in 1956 (A. Uhlir, Bell Syst. Tech. J., Vol. 35, 333 (1956)). Unagami et al. studied an Si dissolution reaction in anodization and reported that positive holes were required in an Si anodization reaction in an HF solution (T. Unagami, J. Electrochem. Soc., Vol. 127, 476 (1980)). This reaction is as follows.

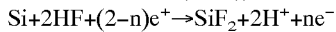
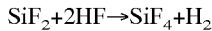
or
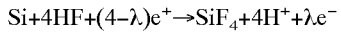
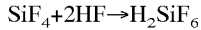

wherein $e^+$ and $e^-$ are the positive hole and the electron, respectively, and n and $\lambda$ are each the number of positive holes required to dissolve one Si atom. If the condition n>2 or $\lambda$>4 is satisfied, porous Si is formed.

The positive holes are required to form porous Si, as described above. P-type Si tends to be more easily modified into porous Si than n-type Si. However, it is known that even n-type Si can be modified into porous Si if positive holes are injected in the n-type Si (R. P. Holmstrom and J. Y. Chi., Appl. Phys. Lett., Vol. 42, 386 (1983)).

This porous Si layer can have a density changing in the range of 1.1 to 0.6 g/cm³ as compared with the density of 2.33 g/cm³ of monocrystalline Si when the HF solution concentration is changed within the range of 50% to 20%. According to observation with a transmission electron microscope, the porous Si layer has pores having an average size of about 600 Å. The porous Si can maintain monocrystallinity although the density thereof is reduced to half or less that of the monocrystalline Si. It is possible to perform epitaxial growth of a porous layer on a monocrystalline Si layer. Since a large number of voids are formed in the porous layer, the density can be reduced to ½ or less. As a result, since the surface area is greatly increased as compared with the volume, the chemical etching rate is greatly increased as compared with the etching rate of the nonporous Si layer.

Figure 29:
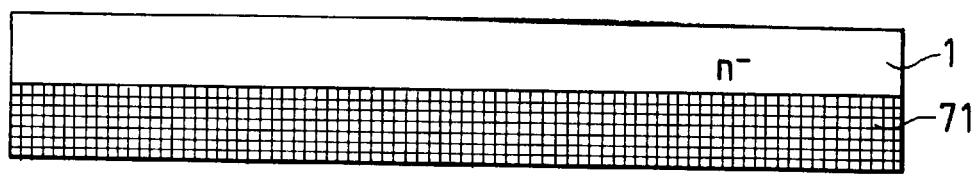
FIGS. 29, 30, 31, 32, 33, 34, and 35 are illustrative sectional views for explaining the steps in manufacturing a semiconductor device according to Embodiment 18 of the present invention.

As shown in FIG. 29, the monocrystalline Si body is anodized into a porous body, thereby forming a porous Si body 71.

Applied voltage: 2.6 (V)
Current density: 7 (mA·cm⁻²)
Anodization solution: HF:H₂O:C₂H₅OH=1:1:1
Porosity: 56 (%)

A nonporous monocrystalline Si layer (n⁻-type layer) 1 is epitaxially grown on the surface of the porous Si body 71. Although the thickness of the monocrystalline Si layer 1 is arbitrarily set, it is set to be 2 μm here. Epitaxial growth is performed by a general method such as thermal CVD, low-pressure CVD, plasma CVD, molecular beam epitaxy, or sputtering.

Figure 30:
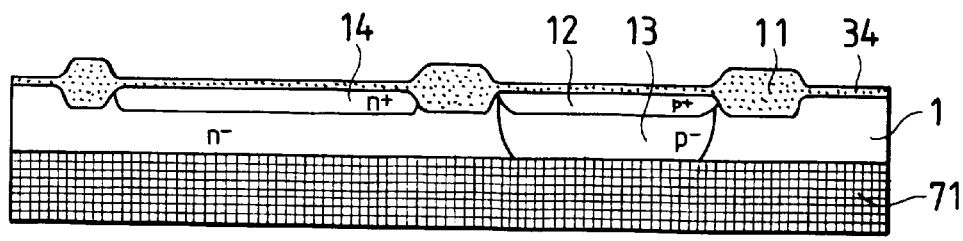
Figure 31:
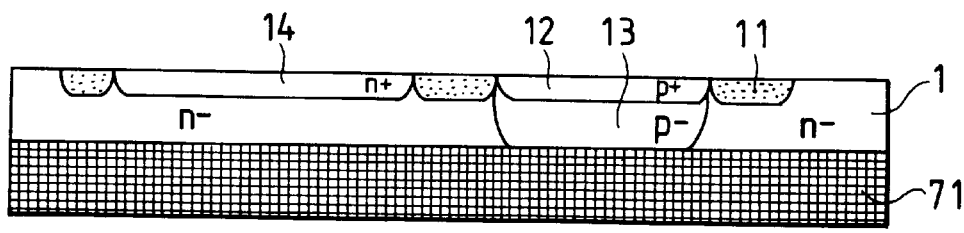

As shown in FIG. 30, thick first selective oxidation regions 11 and a thick oxide film 34 are formed on the monocrystalline Si layer 1 by a normal selective oxidation process. Impurity ions are implanted to form a p⁻-type region 13 and a p⁺-type region 12. An n⁺-type region 14 is also formed. The resultant structure is annealed to activate the impurity, and SOG (Spin On Glass) is coated on the surface. The surface is planarized by reflow. After the planarization, SiO₂ is etched to obtain a structure shown in FIG. 31. In this embodiment, first selective oxidation regions 4 also serve as alignment marks.

Figure 32:
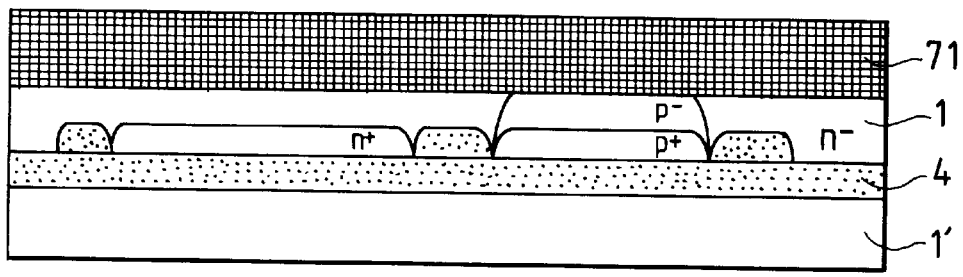

As shown in FIG. 32, after a monocrystalline Si body 1' having the oxide films 4 is cleaned, it is brought into contact with the surface of the monocrystalline Si layer 1. Annealing is performed to bond them in an atmosphere of oxygen, nitrogen, hydrogen, or a diluted gas.

Note that the bonding force at the interface is generally increased when the annealing temperature is increased due to the following reason. When the annealing temperature is about 200° C. or more, combined hydrogen and oxygen atoms are dehydrated in the form of H₂O and then form a condensed silanol bond (Si—O—Si). In this case, while the dehydrated H₂O is left in the form of a void near the interface, the bonding force is not maximum. The bonding force becomes maximum when the voids are perfectly diffused and perfectly disappear. In this state, the bonding force is saturated and is not further increased even if annealing at a higher temperature is performed. The temperature at which the bonding force is saturated is about 1,100° C. In this embodiment, the annealing temperature is set to be about 1,000° C.

Figure 33:
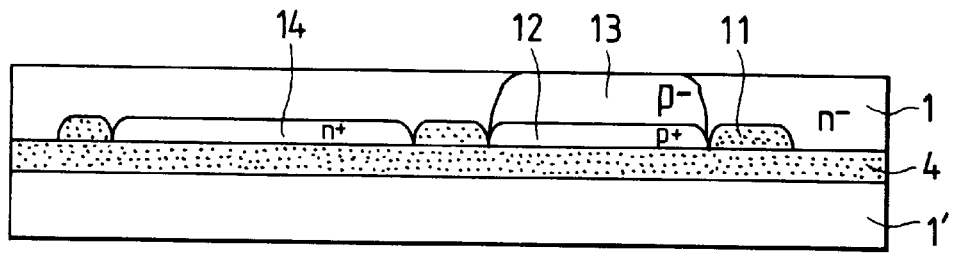

The porous Si body 71 is etched using the following etching solution to obtain a structure shown in FIG. 33. An example of the etching solution capable of selectively etching the porous Si body 71 with respect to the single crystal is a hydrofluoric acid-based etching solution such as hydrofluoric acid or a buffered hydrofluoric acid. Alcohol such as methanol, ethanol, propanol, or isopropanol is added to such an etching solution, so that bubbles of the reaction product gas in etching can be instantaneously removed from the etched surface without stirring the etching solution. Therefore, the porous Si can be uniformly and efficiently etched. When a hydrogen peroxide solution is added to the etching solution, Si oxidation can be accelerated, and the reaction rate can be increased as compared with an etching solution not containing the hydrogen peroxide solution. When the content of the hydrogen peroxide solution in the etching solution is changed, the reaction rate can be controlled.

In this embodiment, the porous Si body 71 is selectively etched without any stirring, using a solution mixture (10:6:50) of 49% hydrofluoric acid, alcohol, and a 30% hydrogen peroxide solution. The porous Si body is selectively and perfectly removed.

Figure 34:
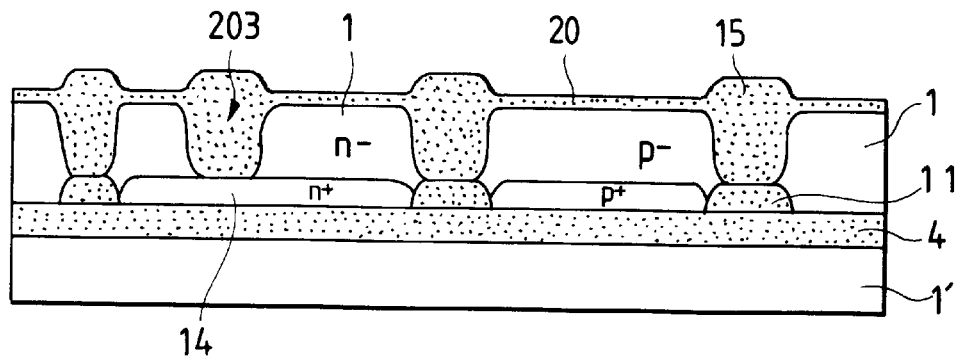

As shown in FIG. 34, second selective oxidation regions 15 and a thin oxide film 20 are formed on the monocrystalline Si layer 1 with reference to the first selective oxidation regions 11 serving as alignment marks in accordance with a normal selective oxidation process. Selective oxidation is performed to a position reaching the first selective oxidation regions 11, so that the element region can be perfectly electrically insulated. However, oxidation of the second selective oxidation region 203 on the $n^+$-type region 14 to connect the $n^-$-type region 1 constituting the collector of the npn transistor to the Al electrode is stopped on the $n^+$-type region 14. The edges of the first selective oxidation regions 11 serving as the alignment marks are detected by an He—Ne laser upon radiation of a laser beam incident on the upper surface. The second selective oxidation regions 15 are formed with reference to the detected edges. When the first selective oxidation regions 11 cannot be used as the alignment marks, other alignment mark selective oxidation regions may be formed.

Figure 35:
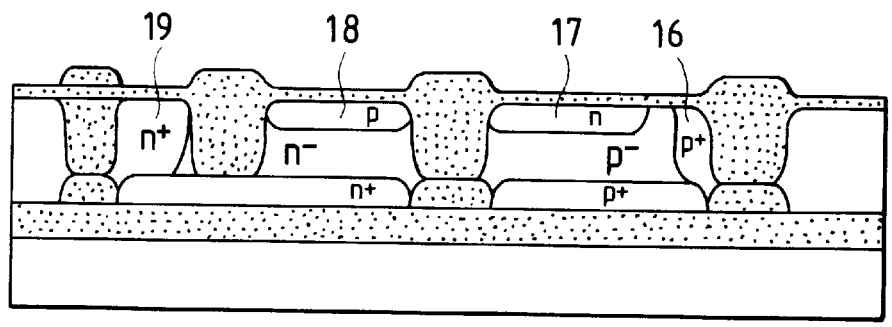

As shown in FIG. 35, impurity ions are sequentially implanted to form an n-type region 17, an $n^+$-type region 19, a $p^+$-type region 16, and a p-type region 18, and annealing is performed to activate the impurities.

The semiconductor device having the bipolar transistor structure shown in FIG. 5 is manufactured by the normal semiconductor manufacturing process.

In this embodiment, the selective oxidation film is used as the isolation insulating layer. However, the isolation insulating layer is not limited to this. If an insulating layer can be buried at a predetermined position, the material is not limited to $SiO_2$ but can be constituted by SiN, a multilayered structure of $SiO_2$ and SiN, or SiON.

Embodiment 19

Figure 36:
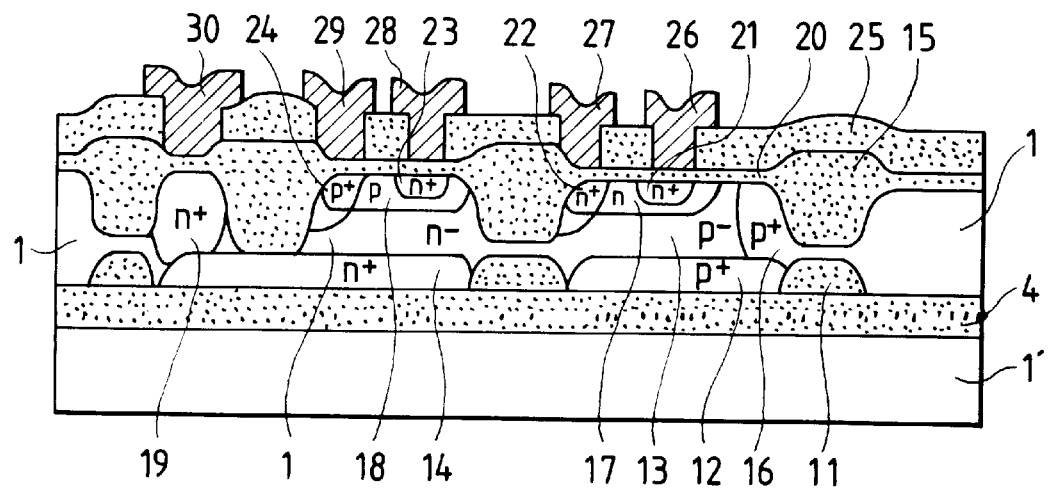
FIG. 36 is an illustrative sectional view showing a semiconductor device according to Embodiment 19 of the present invention.

In this embodiment, oxidation of first and second selective oxidation regions 11 and 15 is stopped at a predetermined depth where they are not in contact with each other in Embodiment 18. FIG. 36 is a sectional view for explaining a semiconductor device having a bipolar transistor structure of Embodiment 19 of the present invention. The same reference numerals as in Embodiment 18 denote the same parts in Embodiment 19, and a detailed description thereof will be omitted.

In this embodiment, as shown in FIG. 36, selective oxidation is stopped at the predetermined depth where the first selective oxidation regions 11 are not in contact with the second selective oxidation regions 15. The following effects can be obtained by the above arrangement.

① The time required for forming the selective oxidation films can be shortened, unnecessary diffusion of impurities can be suppressed, and shallow impurity semiconductor regions can be formed.

② When the first selective oxidation regions 11 are to be manufactured and the porous Si substrate is heated for a long period of time, the porous Si substrate is modified to fail to assure a high etching selectivity ratio with the monocrystalline layer. In this embodiment, however, the first selective oxidation regions 11 can be manufactured under the condition that the porous Si substrate is not modified.

③ An impurity such as boron is diffused from the porous Si layer to a monocrystalline Si layer 1 by annealing, and a leakage current may be undesirably increased. In this embodiment, the first selective oxidation regions 11 can be formed under the condition that diffusion of the impurity such as boron does not pose any problem.

Embodiment 20

According to this embodiment, the present invention is applied to a MOS transistor.

Figure 37:
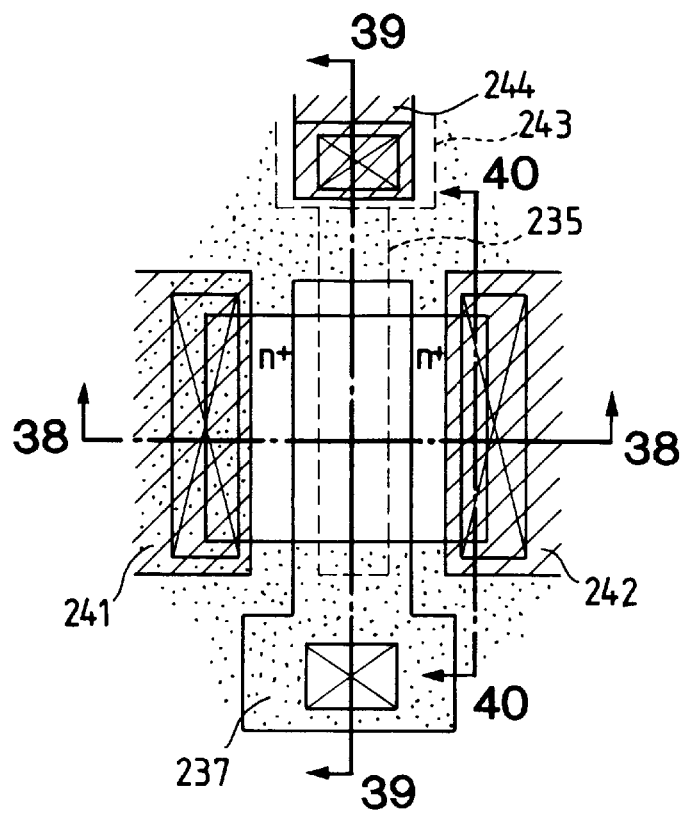
FIG. 37 is an illustrative plan view of a semiconductor device according to Embodiment 20 of the present invention.
Figure 38:
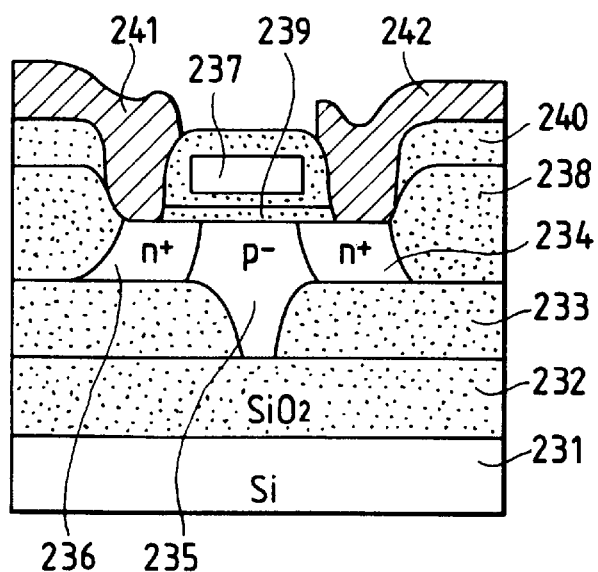
FIG. 38 is an illustrative sectional view of the semiconductor device in FIG. 37 along the line CC'.
Figure 39:
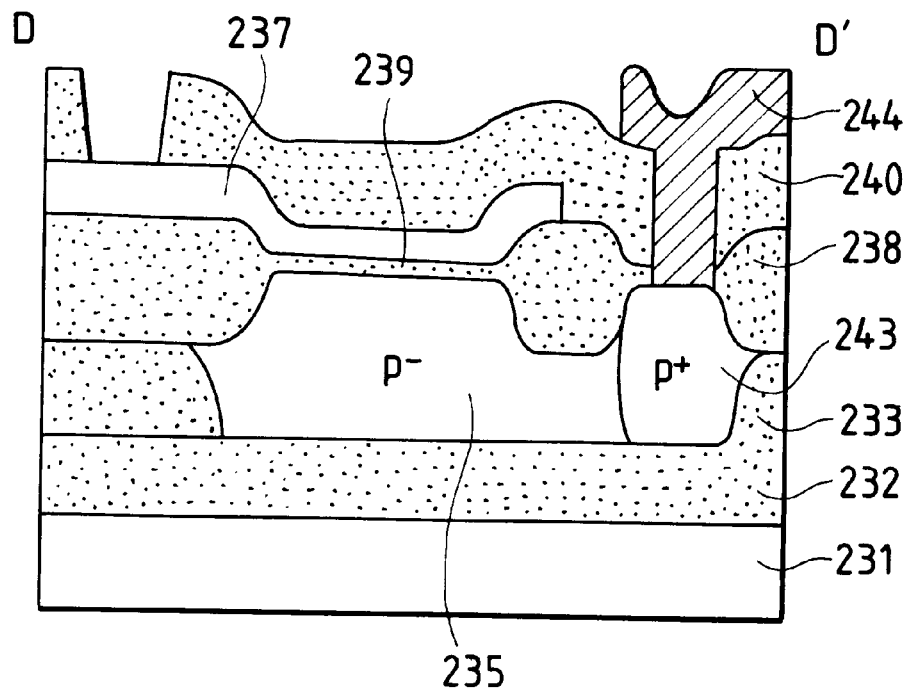
FIG. 39 is an illustrative sectional view of the semiconductor device in FIG. 37 along the line DD'.
Figure 40:
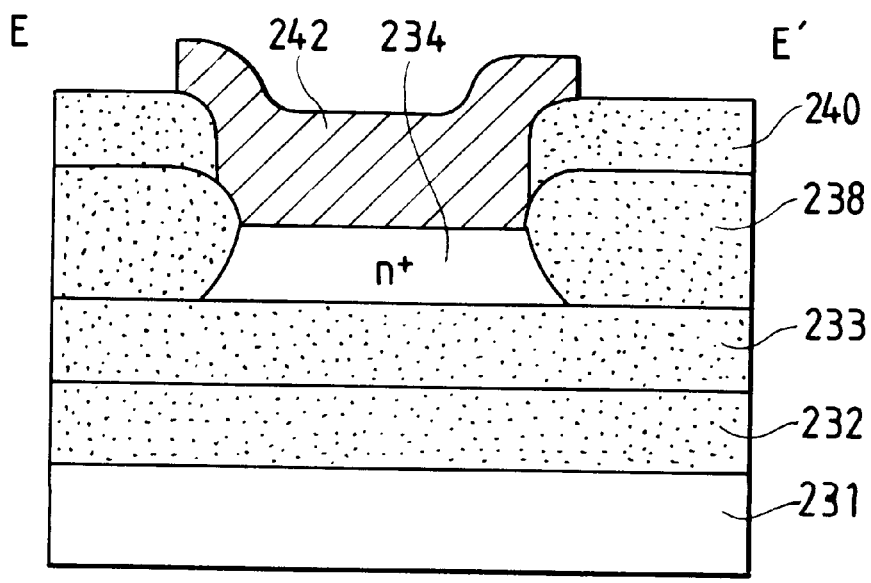
FIG. 40 is an illustrative sectional view of the semiconductor device in FIG. 37 along the line EE'.

FIG. 37 is a plan view for explaining the arrangement of the MOS transistor according to Embodiment 20 of the present invention. FIG. 38 is a sectional view of the MOS transistor along the line CC' of FIG. 37, FIG. 39 is a sectional view of the MOS transistor along the line DD' thereof, and FIG. 40 is a sectional view of the MOS transistor along the line EE' thereof.

Referring to FIGS. 37 to 40, the structure includes a monocrystalline Si body 231, an $SiO_2$ oxide film 232 formed on the body 231, first selective oxidation regions 233, source, channel, and drain regions 234, 235, and 236 constituting an n-type MOS transistor, a gate electrode 237, second selective oxidation regions 238, a gate insulating film 239, an oxide film 240, drain and source electrodes 241 and 242, a $p^+$-type region 243 connected to the lower region of a channel region 235, and an electrode 244 connected to the $p^+$-type region 238. In this case, the first and second selective oxidation regions 233 and 238 are in contact with each other to electrically insulate the semiconductor region as in the first and second selective oxidation regions 11 and 15 of Embodiment 18.

In Embodiment 20, in the n-type MOS transistor, the lower region of the channel region 235 is connected to the $p^+$-type region 243 and the electrode 244 to obtain an electrical contact of the channel region, thereby improving the OFF characteristics of the MOS transistor.

The manufacturing process of the n-type MOS transistor of this embodiment is substantially the same as that described with reference to FIGS. 29 to 35 except for steps caused by structural differences between the MOS and bipolar transistors, and a detailed description thereof will be omitted.

Embodiment 21

According to this embodiment, the present invention is applied to a short-channel MOS transistor.

Figure 41:
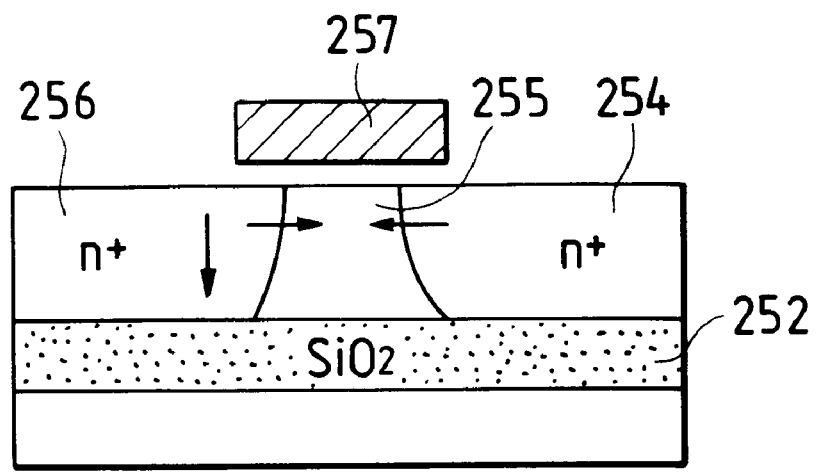
FIG. 41 is an illustrative sectional view for explaining the function of the semiconductor device.

In general, when the channel length is decreased, a short-channel effect appears such that a threshold voltage is changed. A method of forming shallow diffusion regions (source and drain regions) is available as one of the means for preventing the short-channel effect. Judging from this viewpoint, it is preferable to cause the source and drain regions to reach the underlying $SiO_2$ layer in formation of a short-channel MOS transistor on an SOI body. As shown in FIG. 41, however, when source and drain regions 254 and 256 are diffused to an underlying SiO₂ layer 252, lateral diffusion occurs to reduce $L_{eff}$ of the short-channel MOS transistor. Punchthrough tends to occur. In this embodiment, the depth of each n⁺-type layer is minimized, and first selective oxidation regions are formed immediately under the source and drain regions contacting the underlying SiO₂ layer.

Figure 42:
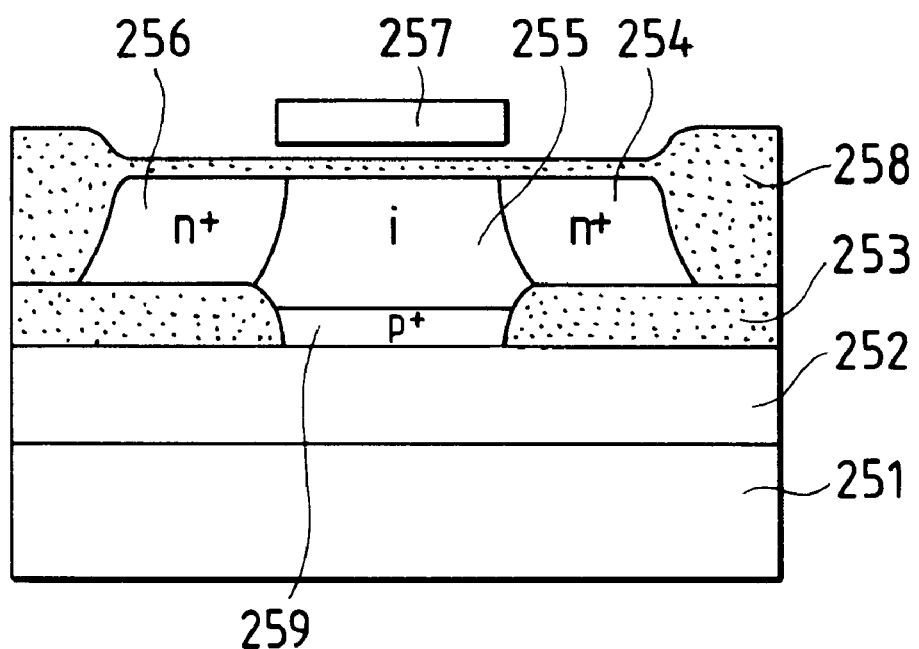
FIG. 42 is an illustrative sectional view showing a semiconductor device according to Embodiment 21 of the present invention.

FIG. 42 is a sectional view for explaining the arrangement of the MOS transistor according to Embodiment 21 of the present invention. Referring to FIG. 42, this arrangement comprises a monocrystalline Si body 251, an SiO₂ oxide film 252 formed on the monocrystalline Si body 251, first oxidation regions 253 formed under the source and drain regions, source, channel, and drain regions 254, 255, and 256 constituting an n-type MOS transistor, a gate electrode 257, second selective oxidation regions 258, and a p-type region 259 formed under the channel region.

In this embodiment, the SiO₂ layer must be formed immediately under the source and drain regions. This structure can be obtained as follows. As shown in FIG. 29, after the monocrystalline Si layer 255 is formed on the porous Si body, the p-type region 259 is formed by impurity ion implantation, and the first selective oxidation regions 253 serving as alignment marks are formed in the monocrystalline Si layer 255. The resultant structure is bonded to the monocrystalline body 251 having the oxide film 252. The edges of the first selective oxidation regions 253 serving as the alignment marks are detected, and the gate electrode 257 is formed on the gate insulating film. Impurity ions are implanted using the gate electrode 257 as a mask, and annealing is performed to form the source and drain regions 254 and 256.

When the p-type region 259 is connected to an external electrode in the same manner as in FIG. 39 (Embodiment 20), OFF characteristics of the MOS transistor can be improved.

Embodiment 22

According to this embodiment, the present invention is applied to a transfer gate of a CMOS structure.

Figure 43:
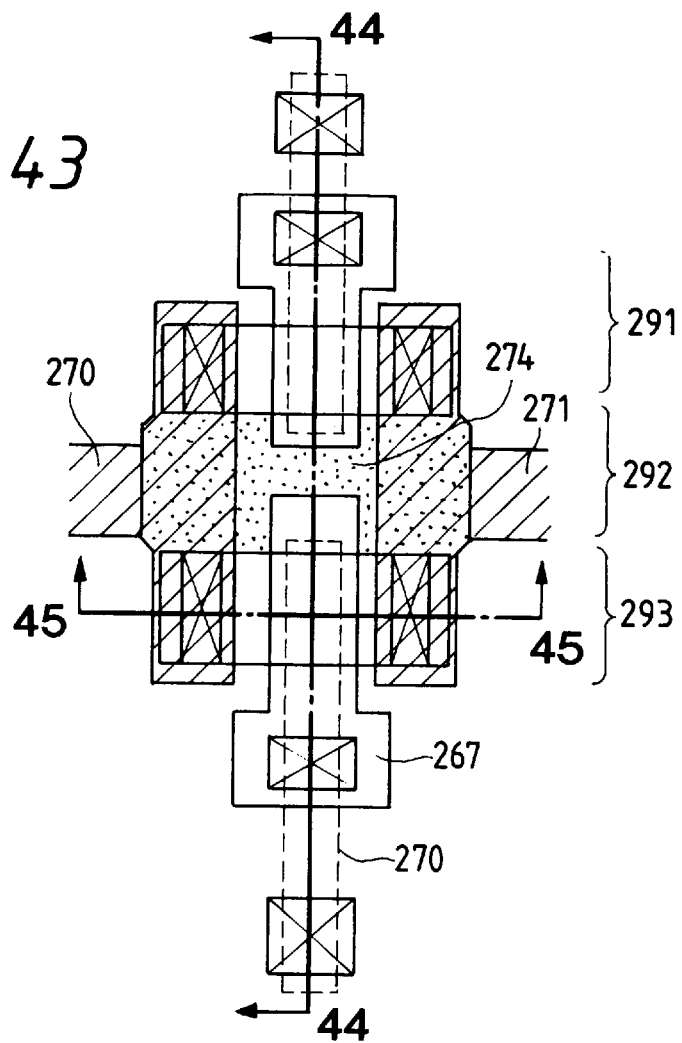
FIG. 43 is an illustrative plan view of a semiconductor device according to Embodiment 22 of the present invention.
Figure 44:
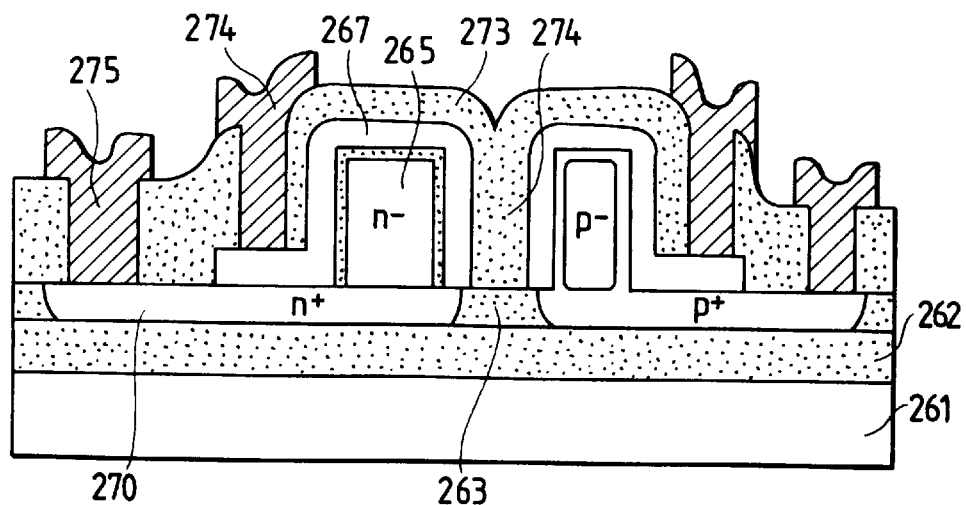
FIG. 44 is an illustrative sectional view of the semiconductor device in FIG. 43 along the line GG'.

FIG. 43 is a plan view for explaining the arrangement of the transfer gate according to Embodiment 22 of the present invention, FIG. 44 is a sectional view thereof along the line GG' of FIG. 43, and FIG. 45 is a sectional view thereof along the line FF' of FIG. 43.

Referring to FIG. 43, the arrangement comprises an n-type MOS transistor 291, a space 292, and a p-type MOS transistor 293. More specifically, referring to FIGS. 43 to 45, the arrangement comprises a monocrystalline Si body 261, an SiO oxide film 262 formed on the monocrystalline Si body 261, first selective oxidation regions 263, source, channel, and drain regions 264, 265, and 266 constituting the p-type MOS transistor, a gate electrode 267, second selective oxidation regions 268, a gate insulating film 269, an n⁺-type region 270 connected to the channel region 265, drain and source electrodes 271 and 272, an SiO₂ oxide film 273 formed on the gate electrode, an SiO₂ oxide region 274 for isolating the n-type MOS transistor 291 from the p-type MOS transistor 293, and an electrode 275 connected to the n⁺-type region 270. Note that the first and second selective oxidation regions 263 and 268 are in contact with each other to electrically insulate the semiconductor region. The p-type MOS transistor 293 and the n-type MOS transistor 291 are identical except for the conductivity types, and a detailed description thereof will be omitted.

In this structure, in addition to the effects of Embodiment 20, since the gate electrodes of the MOS transistors oppose each other and a vertical field strength is weak with respect to carrier movement, a high mobility and a good gm characteristics can be obtained. Generation of hot carriers can be prevented by field relaxation, and the service life of the element is prolonged. In addition, the capacitance of the Si portion under the gate oxide film is reduced, so that the S factor (subthreshold swing) characteristics can be improved, and the leakage current can be minimized.

As described above in detail, in the semiconductor devices of Embodiments 18 to 22, the insulating regions are formed from both the surfaces of the monocrystalline semiconductor layer to insulate the element region, and the area of the insulating isolation region can be reduced.

The insulating isolation region can be formed as needed.

In addition, the semiconductor device has a high mobility and good gm characteristics, a long service life, and a small leakage current. In addition, the above characteristics can be further improved using a monocrystalline semiconductor layer having excellent crystallinity and a uniform thickness.

The transistor of the above embodiment is compared with a MOS field effect transistor using a conventional SOI technique.

FIG. 46 is a sectional view showing the arrangement of the NMOS field effect transistor as an example compared.

Referring to FIG. 46, this arrangement comprises a monocrystalline Si body 2101, an SiO₂ layer 2102 formed on the monocrystalline Si body 2101, a selective oxidation region 2103, source, channel, drain regions 2104, 2105, and 2106, a gate electrode 2107, and source and drain electrodes 2108 and 2109.

In the NMOS field effect transistor having the above arrangement, since the semiconductor region is perfectly electrically isolated by the SiO₂ layer 2102 and the field oxide film 2103, no contact is made for the channel region, and the channel region is kept floating. The potential of the channel region cannot be fixed, and the operation is unstable. As shown in FIGS. 47A and 47B, when the minority carriers generated in the ON state of the transistor cannot be moved in an OFF state of the transistor. These carriers are left in the channel region until they disappear at the end of recombination. A current continuously flows in the OFF state to result in poor OFF characteristics. A pulse shown in FIG. 47A is input to the gate, and FIG. 47B shows a corresponding response waveform of the SOI-MOS field effect transistor.

According to a semiconductor device and a method of manufacturing the same of the present invention, the semiconductor device is a high-performance device having an impurity profile unlike that of the conventional device.

In addition, according to a semiconductor device and a method of manufacturing the same of the present invention, the area of the element isolation region can be reduced, and the integration density of the semiconductor function element can be increased.

In addition, according to a semiconductor device and a method of manufacturing the same of the present invention, alignment can be accurately performed to manufacture a new and improved semiconductor device having the above effects.

What is claimed is:

1. A semiconductor device comprising:
   a substrate having an insulating surface;
   insulating regions disposed on at least a portion of the insulating surface;

a semiconductor layer disposed on at least a portion of the insulating surface and said insulating regions, said semiconductor layer having a plurality of function elements disposed therein; and an upper insulating layer disposed on said semiconductor layer, said upper insulating layer having a plurality of insulating extension portions, each of the insulating extension portions being substantially vertically aligned with and spaced from a respective one of said insulating regions, and being separated from the respective one of said insulating regions by a portion of said semiconductor layer, wherein at least some of said function elements are substantially isolated from others of said functional elements by said insulating extension portions and said insulating regions.

2. A semiconductor device according to claim 1, wherein at least one of said function elements includes an n+ layer that is in contact with said insulating surface, and wherein at least another one of said function elements includes a p+ layer that is in contact with said insulating surface.

3. A semiconductor device according to claim 1, wherein said substrate comprises a semiconductor material, and said insulating surface comprises an insulating film.

4. A semiconductor device according to claim 1, wherein said semiconductor layer has a greater thickness than each of the plurality of insulating extension portions and each of the plurality of insulating regions.

* * * * *

UNITED STATES PATENT AND TRADEMARK OFFICE
CERTIFICATE OF CORRECTION

PATENT NO.    : 5,952,694
DATED         : September 14, 1999
INVENTOR(S)   : MAMORU MIYAWAKI ET AL.

Page 1 of 4

It is certified that error appears in the above-identified patent and that said Letters Patent is hereby corrected as shown below:

COLUMN 4

Line 33, "line AA'" should read --line 4-4--; and
    Line 40, "line BB';" should read --line 7-7;--.

COLUMN 5

Line 52, "line CC';" should read --line 38;--;
    Line 54, "line DD';" should read --line 39;--;
    Line 56, "line EE';" should read --line 40;--; and
    Line 67, "line GG';" should read --line 44;--.

COLUMN 6

Line 2, "line FF';" should read --line 45;--.

COLUMN 7

Line 3, "In one" should read --One--.

COLUMN 8

Line 42, "line AA'." should read --line 4-4.--; and
    Line 61, "first." should read --first--.

UNITED STATES PATENT AND TRADEMARK OFFICE
CERTIFICATE OF CORRECTION

PATENT NO. : 5,952,694
DATED : September 14, 1999
INVENTOR(S) : MAMORU MIYAWAKI ET AL.

It is certified that error appears in the above-identified patent and that said Letters Patent is hereby corrected as shown below:

COLUMN 9

Line 8, "$n^-$-type" should read --$n^+$-type--;
Line 42, "line BB'" should read --line 7-7--; and
Line 61, "on in" should read --on--.

COLUMN 13

Line 40, "insulting" should read --insulating--.

COLUMN 14

Line 3, "dealt." should read --used--.

COLUMN 16

Line 59, "spices" should read --species--.

COLUMN 18

Figure 26A:
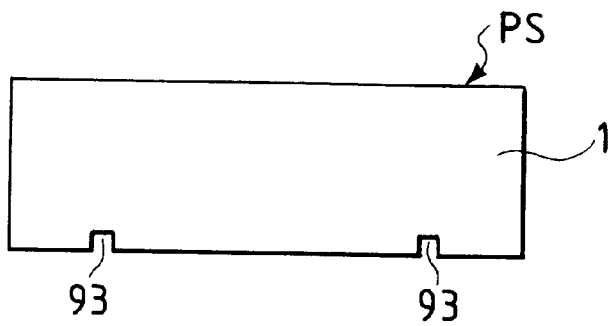
FIGS. 26A to 26D are illustrative sectional views for explaining the steps in manufacturing a semiconductor device according to Embodiment 17 of the present invention.
Figure 26B:
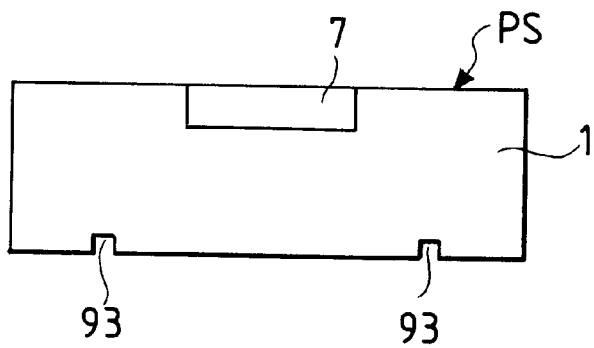
Figure 26C:
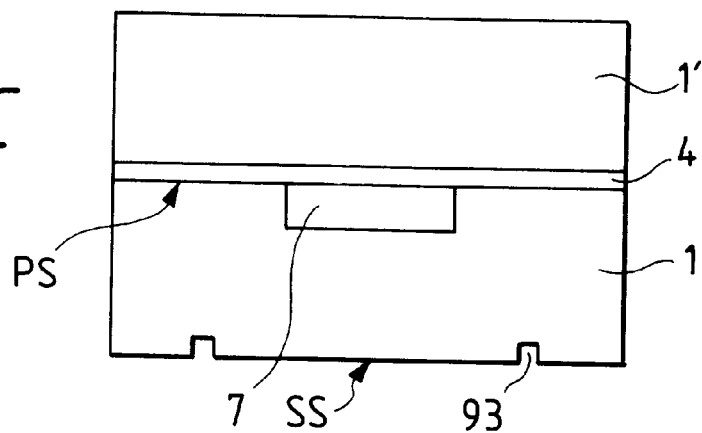
Figure 26D:
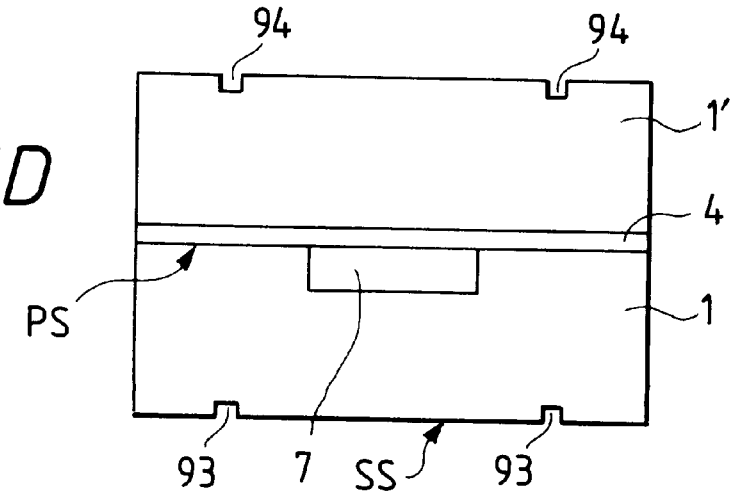

Line 17, "FIGS. 26A)." should read --FIG. 26A).--; and
Line 38, "813" should read --83--.

UNITED STATES PATENT AND TRADEMARK OFFICE
CERTIFICATE OF CORRECTION

PATENT NO.   : 5,952,694
DATED        : September 14, 1999
INVENTOR(S)  : MAMORU MIYAWAKI ET AL.          Page 3 of 4

It is certified that error appears in the above-identified patent and that said Letters Patent is hereby corrected as shown below:

COLUMN 19

Line 1, "pattered" should read --patterned--.

COLUMN 21

Line 55, "15" should read --15 (also referred to as "insulating extension portions")--.

COLUMN 22

Line 26, "line CC'" should read --line 38--;
    Line 27, "line DD'" should read --line 39--; and
    Line 29, "line EE'" should read --line 40--.

COLUMN 23

Line 46, "GG'" should read --44--; and
    Line 47, "line FF'" should read --line 45--.

UNITED STATES PATENT AND TRADEMARK OFFICE
CERTIFICATE OF CORRECTION

PATENT NO.    : 5,952,694
DATED         : September 14, 1999
INVENTOR(S)   : MAMORU MIYAWAKI ET AL.          Page 4 of 4

It is certified that error appears in the above-identified patent and that said Letters Patent is hereby corrected as shown below:

COLUMN 24

Line 41, "transistor. These" should read --transistor, these--.

Signed and Sealed this

Third Day of April, 2001

Attest:

NICHOLAS P. GODICI

Attesting Officer

*Acting Director of the United States Patent and Trademark Office*